(12) United States Patent
Bae et al.

(10) Patent No.: US 10,490,614 B2
(45) Date of Patent: Nov. 26, 2019

(54) DISPLAY DEVICE

(71) Applicant: SAMSUNG DISPLAY CO., LTD., Yongin-si (KR)

(72) Inventors: Subin Bae, Yongin-si (KR); Shinil Choi, Yongin-si (KR); Changok Kim, Yongin-si (KR); Chulmin Bae, Yongin-si (KR); Sanggab Kim, Yongin-si (KR); Sunghoon Yang, Yongin-si (KR); Yeoungkeol Woo, Yongin-si (KR); Yugwang Jeong, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 3 days.

(21) Appl. No.: 15/728,755

(22) Filed: Oct. 10, 2017

(65) Prior Publication Data
US 2018/0166521 A1 Jun. 14, 2018

(30) Foreign Application Priority Data
Dec. 14, 2016 (KR) .......................... 10-2016-0170411

(51) Int. Cl.
*H01L 27/12* (2006.01)
*H01L 29/66* (2006.01)
(Continued)

(52) U.S. Cl.
CPC .......... *H01L 27/3248* (2013.01); *H01L 27/12* (2013.01); *H01L 27/3258* (2013.01);
(Continued)

(58) Field of Classification Search
CPC ........... H01L 27/1214; H01L 29/78645; H01L 29/78648; H01L 29/7869; H01L 29/78696;
(Continued)

(56) References Cited

U.S. PATENT DOCUMENTS 7,342,286 B2 3/2008 Shin et al.
8,815,687 B2 8/2014 Park et al.
(Continued)

FOREIGN PATENT DOCUMENTS

KR 10-1999-0046866 A 7/1999
KR 10-2000-0016846 A 3/2000
(Continued)

*Primary Examiner* — Brian Turner
(74) *Attorney, Agent, or Firm* — Kile Park Reed & Houtteman PLLC

(57) ABSTRACT

A display device includes a thin film transistor, a gate insulting layer, an interlayer insulating layer, a data line, a spacer, and a pixel. The thin film transistor includes a semiconductor layer and a gate electrode. The semiconductor layer includes a source region and a drain region on respective sides of the channel region. The gate insulating layer is between the semiconductor layer and the gate electrode. The interlayer insulating layer covers the thin film transistor. The data line contacts the semiconductor layer via a hole passing through the gate insulating layer and the interlayer insulating layer. The spacer is on an inner wall of the hole and contacting the data line. The pixel electrode is electrically connected to the thin film transistor.

19 Claims, 17 Drawing Sheets

(51) Int. Cl.
  *H01L 29/786* (2006.01)
  *H01L 33/58* (2010.01)
  *H01L 21/4763* (2006.01)
  *H01L 51/56* (2006.01)
  *H01L 27/32* (2006.01)
  *H01L 29/417* (2006.01)

(52) U.S. Cl.
  CPC .... *H01L 27/3276* (2013.01); *H01L 29/78618* (2013.01); *H01L 2227/323* (2013.01)

(58) Field of Classification Search
  CPC ........... H01L 27/1251; H01L 29/66757; H01L 21/02488; H01L 21/02532; H01L 21/02672; H01L 29/458; H01L 27/1277
  See application file for complete search history.

(56) References Cited

U.S. PATENT DOCUMENTS

| | | |
|---|---|---|
| 2004/0232512 A1 | 11/2004 | Hasunuma et al. |
| 2007/0048883 A1* | 3/2007 | Lehr ................ H01L 21/76816 438/14 |
| 2007/0155157 A1* | 7/2007 | Chou ................ H01L 21/76802 438/618 |
| 2011/0024755 A1* | 2/2011 | Korenari ............ H01L 27/1214 257/59 |
| 2013/0222723 A1* | 8/2013 | Kim ........................ H01L 33/58 349/40 |
| 2014/0042593 A1* | 2/2014 | Mauder ............... H01L 29/0657 257/607 |
| 2015/0263079 A1* | 9/2015 | Ko ...................... H01L 27/3265 257/40 |
| 2015/0311351 A1* | 10/2015 | Seko ................. H01L 29/78621 257/72 |
| 2016/0071891 A1* | 3/2016 | Oh ...................... H01L 27/1248 257/72 |
| 2016/0329360 A1* | 11/2016 | Li ..................... H01L 29/78675 |
| 2017/0053916 A1* | 2/2017 | Ching ................ H01L 27/0924 |

FOREIGN PATENT DOCUMENTS

| | | |
|---|---|---|
| KR | 10-2005-0081634 A | 8/2005 |
| KR | 10-2006-0076535 A | 7/2006 |
| KR | 10-2012-0059080 A | 6/2012 |

* cited by examiner

DISPLAY DEVICE

CROSS-REFERENCE TO RELATED APPLICATION

Korean Patent Application No. 10-2016-0170411, filed on Dec. 14, 2016, and entitled, "Display Device," is incorporated by reference herein in its entirety.

BACKGROUND

1. Field

One or more embodiments relate to a display device.

2. Description of the Related Art

A display device generates images based on light emitted from a plurality of pixels. Each pixel is controlled by one or more thin film transistors (TFTs), storage capacitors, and signals carried on various wirings. In an attempt to provide high-quality images, the number of TFTs for controlling each pixel has increased through the years.

SUMMARY

In accordance with one or more embodiments, a display device includes a substrate; a thin film transistor on the substrate and including a semiconductor layer and a gate electrode, the semiconductor layer including a source region and a drain region on respective sides of a channel region; a gate insulating layer between the semiconductor layer and the gate electrode; an interlayer insulating layer covering the thin film transistor; a data line contacting the semiconductor layer via a hole passing through the gate insulating layer and the interlayer insulating layer; a spacer on an inner wall of the hole and contacting the data line; and a pixel electrode electrically connected to the thin film transistor.

A lower surface of the data line may directly contact one of the source region and the drain region, and a surface of the data line facing an inner wall of the hole may directly contact the spacer. The semiconductor layer may include a first region adjacent to a second region, wherein the first region contacts the data line and wherein the first region has a thickness less than the second region. The second region may overlap the gate insulating layer and the interlayer insulating layer. The first region and the second region may be doped with same impurities.

The semiconductor layer may include a third region between the first region and the second region and contacts the spacer. The third region may have a thickness less than the second region. The first region may have a thickness equal to or lower than the third region. The first region may be stepped from the third region, and a connection portion between the first region and the third region may have a forward-tapered slope.

The spacer may include a first lateral surface facing the inner wall of the hole, and a lower surface facing one of the source region or the drain region, wherein the first lateral surface directly contacts the interlayer insulating layer, the gate insulating layer, and the semiconductor layer, and wherein the lower surface directly contacts one of the source region or the drain region.

The thin film transistor may include a driving thin film transistor includes a driving semiconductor layer and a driving gate electrode, the driving semiconductor layer including a driving channel region, a driving source region, and a driving drain region, and the driving gate electrode overlapping the driving channel region; and a switching thin film transistor over the substrate and including a switching semiconductor layer and a switching gate electrode, the switching semiconductor layer including a switching channel region, a switching source region, and a switching drain region, the switching gate electrode overlapping the switching channel region, and the data line contacting one of the switching source region and the switching drain region.

The display device may include a second gate insulating layer between the gate insulating layer and the interlayer insulating layer; and a first storage capacitor plate facing a second storage capacitor plate with the second gate insulating layer therebetween, the spacer directly contacting the interlayer insulating layer, the second gate insulating layer, the gate insulating layer, and the semiconductor layer.

The spacer may extend to an upper surface of the interlayer insulating layer. The spacer may directly contact at least a portion of the upper surface of the interlayer insulating layer. The spacer may include an insulating material. The insulating material may include at least one of SiOx, SiNx, SiON, or SiOC. The spacer may include metal. The spacer may include a same metallic material as the data line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
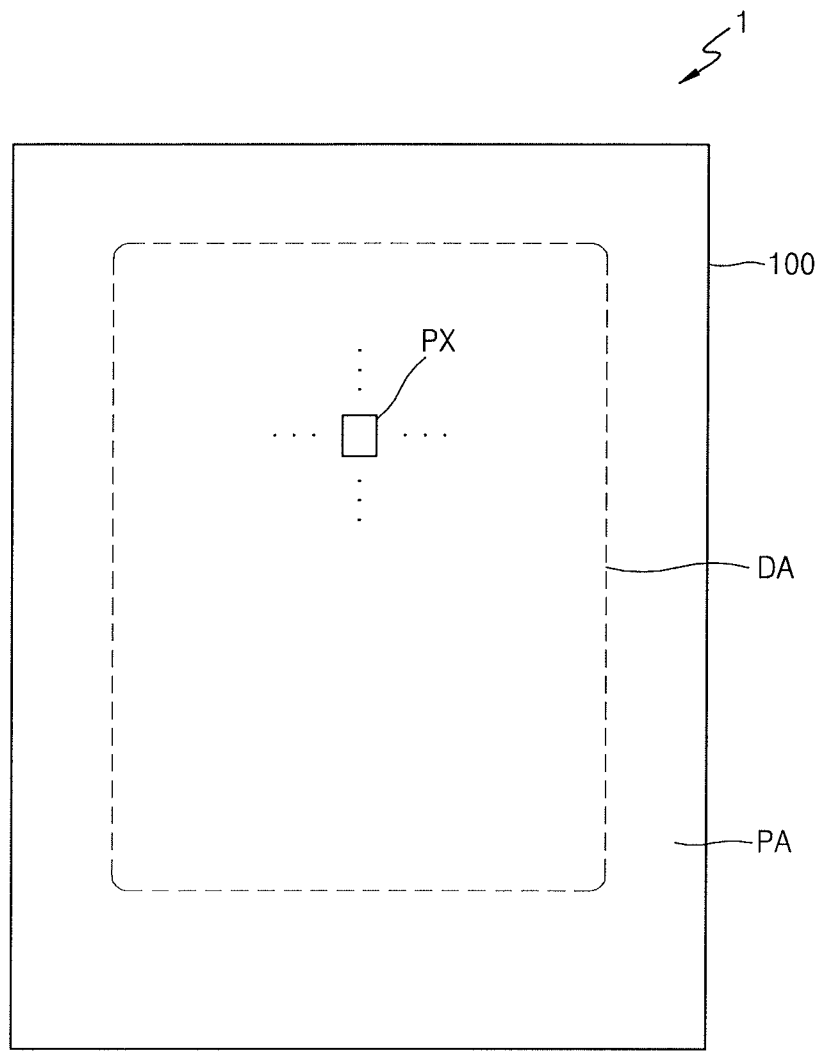
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 is a plan view illustrating an embodiment of a display device 1 which includes a substrate 100. The substrate 100 includes a display area DA and a peripheral area PA outside the display area DA. The display area DA includes a plurality of pixels P, each of which includes at least one display element (e.g., an organic light-emitting device (OLED)). The peripheral area PA includes various wirings for transferring signals to be applied to the pixels in the display area DA. For illustrative purposes, the display device 1 will be described as an OLED display device. In other embodiments, the display device 1 may be another type of display including but not limited to a liquid crystal display device.

Figure 2:
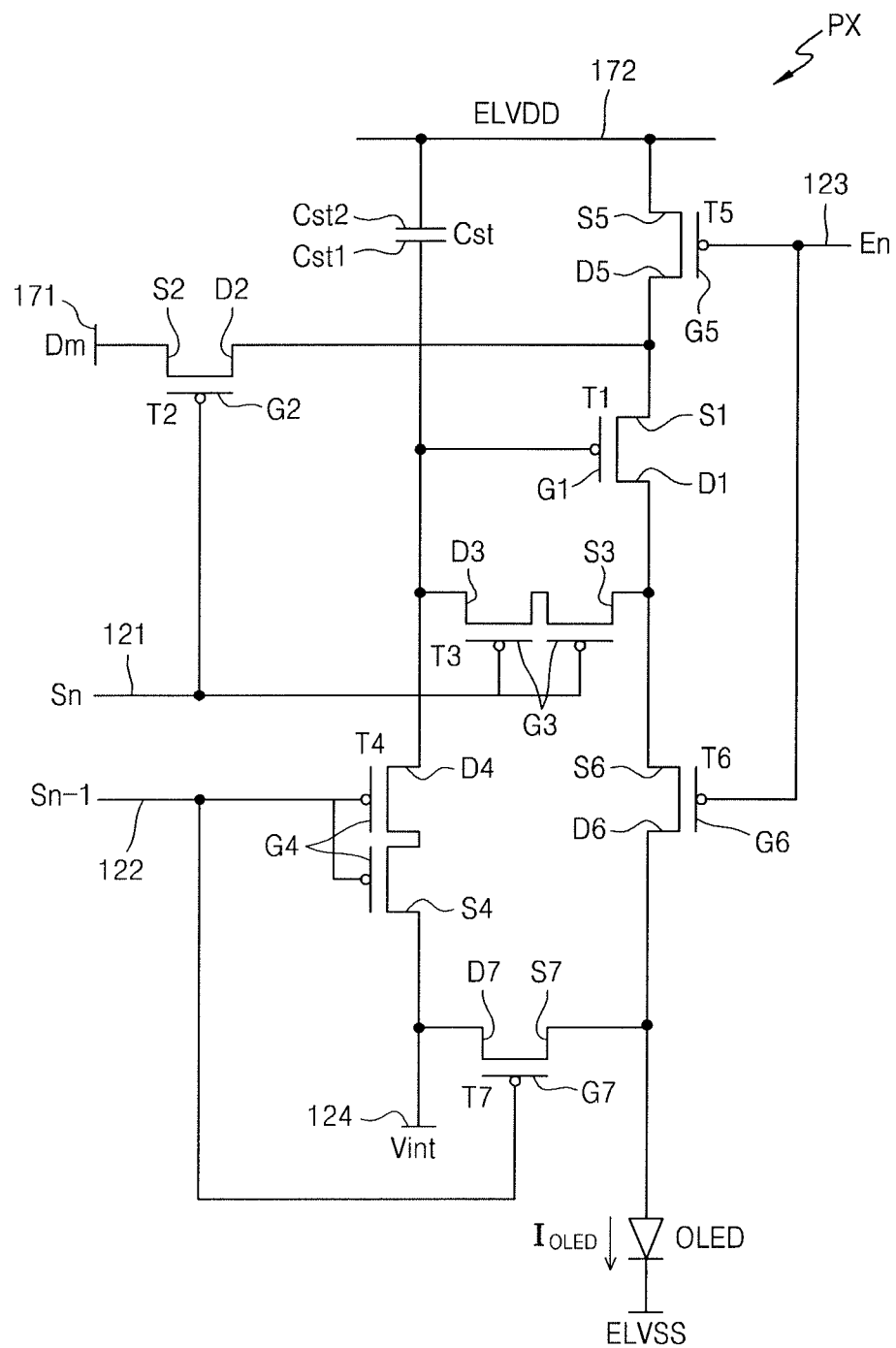
FIG. 2 illustrates an embodiment of a pixel.

FIG. 2 illustrates an embodiment of an equivalent circuit a pixel PX, which, for example, may be representative of the pixels in display device 1. Referring to FIG. 2, pixel PX includes signal lines 121, 122, 123, and 171, a plurality of thin film transistors (TFTs) T1, T2, T3, T4, T5, T6, and T7 connected to the signal lines 121, 122, 123, and 171, a storage capacitor Cst, an initialization voltage line 124, a driving voltage line 172, and the OLED. In FIG. 2, each pixel PX includes the signal lines 121, 122, 123, and 171, the initialization voltage line 124, and the driving voltage line 172, the disclosure is not limited thereto. In another embodiment, at least one of the signal lines 121, 122, 123, and 171, and/or the initialization voltage line 124 may be shared by adjacent pixels (neighboring pixels).

The TFTs may include a driving TFT T1, a switching TFT T2, a compensation TFT T3, a first initialization TFT T4, an operation control TFT 15, an emission control TFT T6, and a second initialization TFT T7.

The signal lines include the scan line 121 transferring a scan signal Sn, the previous scan line 122 for transferring a previous scan signal Sn-1 to the first initialization TFT T4 and the second initialization TFT T7, the emission control line 123 for transferring an emission control signal En to the operation control TFT T5 and the emission control TFT T6, and the data line 171 crossing the scan line 121 and for transferring a data signal Dm. The driving voltage line 172 transfers a driving voltage ELVDD to the driving TFT T1. The initialization voltage line 124 transfers an initialization voltage Vint initializing the driving TFT T1 and the pixel electrode.

The driving TFT T1 includes a driving gate electrode G1 connected to a first storage capacitor plate Cst1 of the storage capacitor Cst, a driving source electrode S1 connected to the driving voltage line 172 via the operation control TFT T5, and a driving drain electrode D1 electrically connected to the pixel electrode of the OLED via the emission control TFT T6. The driving TFT T1 receives a data signal Dm based on a switching operation of the switching TFT 12 and supplies a driving current $I_{OLED}$ to the OLED.

The switching TFT T2 includes a switching gate electrode G2 connected to the scan line 121, a switching source electrode S2 connected to the data line 171, and a switching drain electrode D2 connected to the driving source electrode S1 of the driving TFT T1 and simultaneously connected to the driving voltage line 172 via the operation control TFT T5. The switching TFT T2 is turned on based on a scan signal Sn transferred via the scan line 121 and performs a switching operation of transferring a data signal Dm from the data line 171 to the driving source electrode S1 of the driving TFT T1.

The compensation TFT T3 includes a compensation gate electrode G3 connected to the scan line 121, a compensation source electrode S3 connected to the driving drain electrode D1 of the driving TFT T1 and simultaneously connected to the pixel electrode of the OLED via the emission control TFT T6, and a compensation drain electrode D3 connected to the first storage capacitor plate Cst1 of the storage capacitor Cst, a first initialization drain electrode D4 of the first initialization TFT T4, and the driving gate electrode G1 of the driving TFT T1. The compensation TFT T3 is turned on, based on a scan signal Sn from the scan line 121, to diode-connect the driving TFT T1 by electrically connecting the driving gate electrode G1 of the driving TFT T1 to the driving drain electrode D1 of the driving TFT T1.

The first initialization TFT T4 includes a first initialization gate electrode G4 connected to the previous scan line 122, a first initialization source electrode S4 connected to a second initialization drain electrode D7 of the second initialization TFT T7 and the initialization voltage line 124, and a first initialization drain electrode D4 connected to the first storage capacitor plate Cst1 of the storage capacitor Cst, the compensation drain electrode D3 of the compensation TFT T3, and the driving gate electrode G1 of the driving TFT T1. The first initialization TFT T4 is turned on, based on a previous scan signal Sn-1 from the previous scan line 122, to initialize a voltage of the driving gate electrode G1 of the driving TFT T1 by transferring the initialization voltage Vint to the driving gate electrode G1 of the driving TFT T1.

The operation control TFT T5 includes a operation control gate electrode G5 connected to the emission control line 123, an operation control source electrode S5 connected to the driving voltage line 172, and an operation control drain electrode D5 connected to the driving source electrode S1 of the driving TFT T1 and the switching drain electrode D2 of the switching TFT T2.

The emission control TFT T6 includes an emission control gate electrode G6 connected to the emission control line 123, an emission control source electrode S6 connected to the driving drain electrode D1 of the driving TFT T1 and the compensation source electrode S3 of the compensation TFT T3, and an emission control drain electrode D6 electrically connected to a second initialization source electrode S7 of the second initialization TFT T7 and the pixel electrode of the OLED.

The operation control TFT T5 and the emission control TFT T6 are simultaneously turned on, based on an emission control signal En from the emission control line 123, to transfer the driving voltage ELVDD to the OLED and the driving current $I_{OLED}$ through the OLED.

The second initialization TFT T7 includes a second initialization gate electrode G7 connected to the previous scan line 122, a second initialization source electrode S7 connected to the emission control drain electrode D6 of the emission control TFT T6 and the pixel electrode of the OLED, and a second initialization drain electrode D7 connected to the first initialization source electrode S4 of the first initialization TFT T4 and the initialization voltage line 124. The second initialization TFT T7 is turned on, based on a previous scan signal Sn-1 from the previous scan line 122, to initialize the pixel electrode of the OLED.

In FIG. 2, the first initialization TFT T4 is connected to the second initialization TFT T7 by the previous scan line 122. In another embodiment, the first initialization TFT T4 may be connected to the previous scan line 122 and driven by a previous scan signal Sn-1, and the second initialization TFT T7 may be connected to a separate signal line (e.g. a next scan line) and driven by a signal transferred via the separate signal line.

The storage capacitor Cst includes a second storage capacitor plate Cst2 connected to the driving voltage line 172 and an opposite electrode of the OLED connected to a common voltage ELVSS. Therefore, the OLED may emit light based on the driving current $I_{OLED}$ from the driving TFT T1 to generate an image.

In FIG. 2, the compensation TFT T3 and the first initialization TFT T4 have dual-gate electrodes. In one embodiment, the compensation TFT T3 and the first initialization TFT T4 may have one gate electrode. Also, in one embodiment, at least one of the TFTs T1, T2, T5, T6, or T7, other than the compensation TFT T3 and the first initialization TFT T4, may have dual-gate electrodes.

Operation of pixel PX occurs in various periods. During an initialization period, the first initialization TFT T4 is turned on based on a previous scan signal Sn-1 from the previous scan line 122. Also, the driving TFT T1 is initialized by the initialization voltage Vint supplied via the initialization voltage line 124.

During a data programming period, the switching TFT T2 and the compensation TFT T3 are turned on based on the scan signal Sn from the scan line 121. In this case, the driving TFT T1 is diode-connected and forward-biased by the turned-on compensation TFT T3.

A compensation voltage Dm+Vth (Vth has a negative (−) value), which is reduced by a threshold voltage Vth of the driving TFT T1 from the data signal Dm supplied via the data line 171, is applied to the driving gate electrode G1 of the driving TFT T1. The driving voltage ELVDD and the compensation voltage Dm+Vth are applied to opposite ends of the storage capacitor Cst, and the storage capacitor Cst stores a charge corresponding to a voltage difference between the opposite ends.

During an emission period, the operation control TFT T5 and the emission control TFT T6 are turned on based on an emission control signal En from the emission control line 123. The driving current $I_{OLED}$, corresponding to a voltage difference between the voltage of the driving gate electrode G1 of the driving TFT T1 and the driving voltage ELVDD, is supplied to the OLED via the emission control TFT T6. The pixel PX in FIG. 2 includes seven TFTs. In another embodiment, the pixel PX may include a different number of transistors and/or structure.

Figure 3:
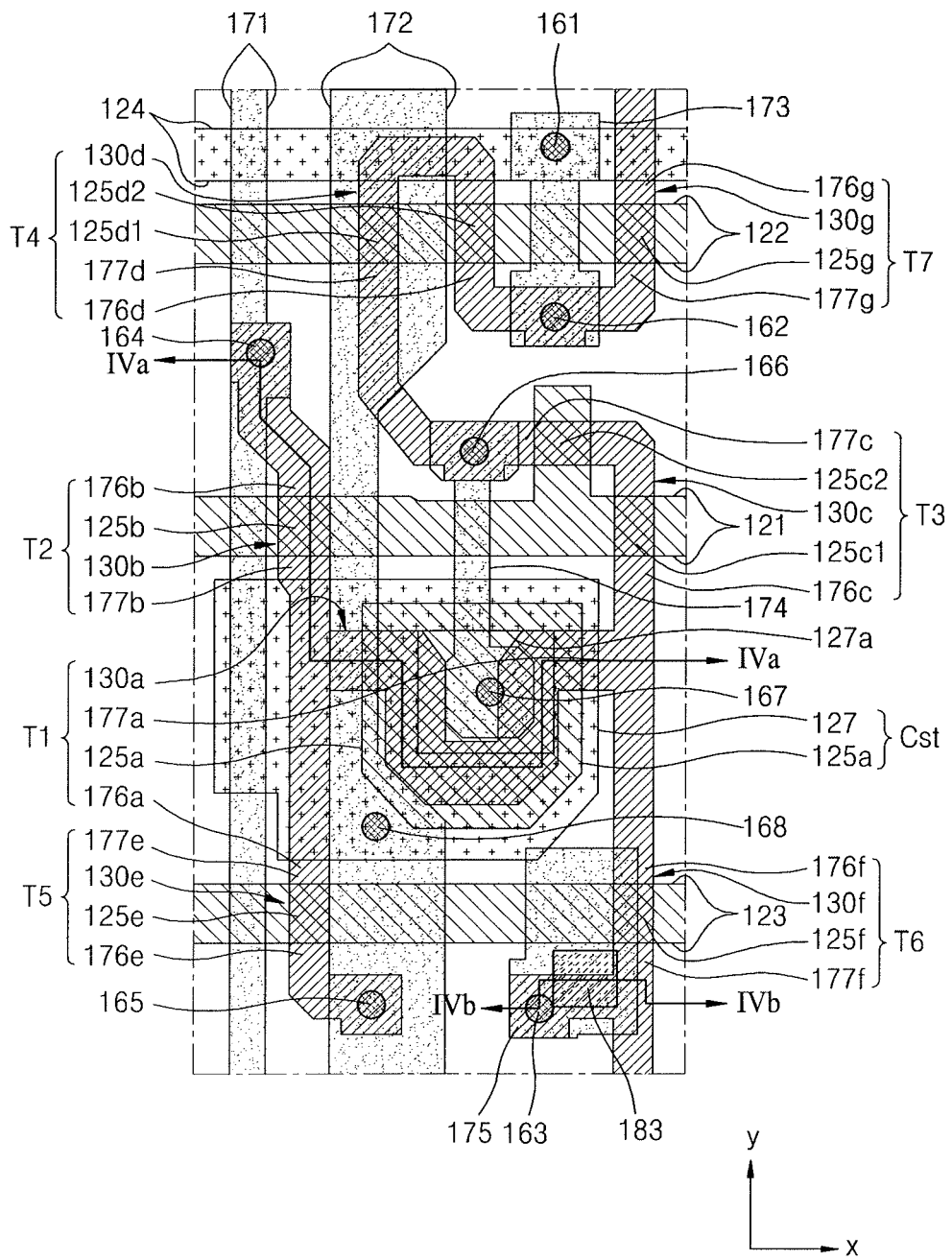
FIG. 3 illustrates a layout embodiment of the pixel.
Figure 4:
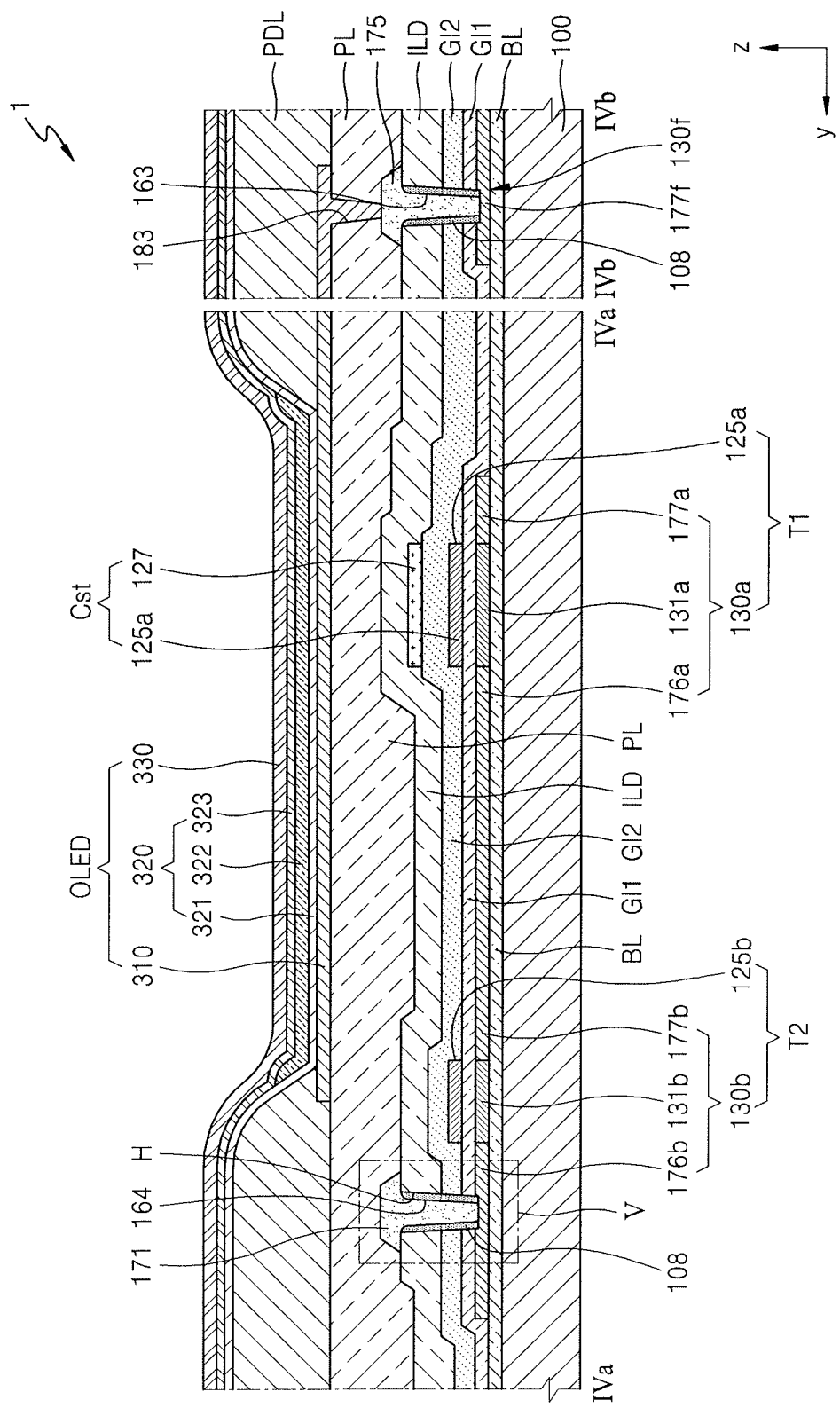
FIG. 4 illustrates a view along section lines IVa-IVa and IVb-IVb in FIG. 3.

FIG. 3 illustrates a layout embodiment of the pixel PX. FIG. 4 illustrates an embodiment of a view taken along lines IVa-IVa and IVb-IVb in FIG. 3.

Referring to FIG. 3, the pixel PX includes the scan line 121, the previous scan line 122, the emission control line 123, and the initialization voltage line 124 extending in a row direction (an x-axis direction or a first direction) for respectively applying a scan signal Sn, a previous scan signal Sn-1, an emission control signal En, and an initialization voltage Vint. Also, the pixel PX includes the data line 171 and the driving voltage line 172 extending in a column direction (a y-axis direction or a second direction) crossing the scan line 121, the previous scan line 122, the emission control line 123, and the initialization voltage line 124, the data line 171 and the driving voltage line 172 for respectively applying a data signal Dm and the driving voltage ELVDD.

The pixel PX includes the TFTs T1, T2, T3, T4, T5, 16, and T7, the storage capacitor Cst, and an OLED (e.g., see FIG. 4) electrically connected to the TFTs T1, T2, T3, T4, T5, T6, and T7, and the storage capacitor Cst.

The driving TFT T1, the switching TFT T2, the compensation TFT T3, the first initialization TFT T4, the operation control TFT T5, the emission control TFT T6, and the second initialization TFT T7 are arranged along a semiconductor layer, and the semiconductor layer may be curved in various shapes.

Referring to FIGS. 3 and 4, the semiconductor layer is over the substrate 100, for example, on a buffer layer BL on the substrate 100. The substrate 100 may include various materials such as a glass material or a plastic material such as polyethylene terephthalate (PET), polyethylene naphthalate (PEN), and polyimide (PI). When the substrate 100 includes a plastic material, the substrate 100 may have greater flexibility than when the substrate 100 includes a glass material. The buffer layer BL including SiOx and/or SiNx may be on the substrate 100 to prevent penetration of impurities.

The semiconductor layer may include a driving semiconductor layer 130a of the driving TFT T1, a switching semiconductor layer 130b of the switching TFT T2, a compensation semiconductor layer 130c of the compensation TFT T3, a first initialization semiconductor layer 130d of the first initialization TFT T4, an operation control semiconductor layer 130e of the operation control TFT T5, an emission control semiconductor layer 130f of the emission control TFT T6, and a second initialization semiconductor layer 130g of the second initialization TFT T7, and these TFTs may be connected to each other.

In an embodiment, the semiconductor layer may include polycrystalline silicon. The semiconductor layer may include a channel region not doped with impurities, and a source region and a drain region at opposite sides of the channel region and doped with impurities. The channel region is a region of the semiconductor layer overlapping the scan line 121, the previous scan line 122, the emission control line 123 or the driving gate electrode 125a. The source region and the drain region may be formed by doping the relevant regions with impurities using the scan line 121, the previous scan line 122, or the emission control line 123 or the driving gate electrode 125a as self-align masks. The impurities may change depending on the type of TFT, e.g., may include N-type impurities or P-type impurities. The source region and the drain region correspond to a source electrode and a drain electrode of a TFT. For illustrative purposes, the terms source region and a drain region are used instead of the terms source electrode and a drain electrode.

As illustrated in FIGS. 3 and 4, the driving TFT T1 includes the driving semiconductor layer 130a, a driving gate electrode 125a, a driving source region 176a, and a driving drain electrode 177a. A driving channel region 131a is a portion of the driving semiconductor layer 130a overlapping the driving gate electrode 125a. The driving channel region 131a has a curved shape and thus may have a long channel length. FIG. 3 illustrates the shape of curvature of the driving channel region 131a as an "omega" shape (S2 shape), but this shape may be different in other embodiments.

The driving gate electrode 125a may serve as the driving gate electrode 125a of the driving TFT T1 and simultaneously as the first storage capacitor plate of the storage capacitor Cst. A first gate insulating layer GI1 is between the driving semiconductor layer 130a and the driving gate electrode 125a. The first gate insulating layer GI1 may include an inorganic insulating material. The driving source region 176a is connected to a switching drain region 177b and an operation control drain region 177e described below. The driving drain region 177a is connected to a compensation source region 176c and an emission control source region 176f described below.

The switching TFT T2 includes a switching semiconductor layer 130b, a switching gate electrode 125b, a switching source region 176b, and a switching drain region 177b. A switching channel region 131b is a portion of the switching semiconductor layer 130b overlapping the switching gate electrode 125b. The switching gate electrode 125b corresponds to a portion of the scan line 121.

One of the switching source region 176b or the switching drain region 177b may be connected to the data line 171. The other of the switching source region 176b or the switching drain region 177b may be connected to the driving TFT T1 and the operation control TFT T5. For example, the switching source region 176b may be electrically connected to the data line 171 via a contact hole 164 in the first gate insulating layer GI1, a second gate insulating layer GI2, and an interlayer insulating layer ILD. The second gate insulating layer GI2 and the interlayer insulating layer ILD may include an inorganic insulating material. The switching drain region 177b is connected to the driving TFT T1 and the operation control TFT T5.

The compensation TFT T3 includes a compensation semiconductor layer 130c, compensation gate electrodes 125c1 and 125c2, the compensation source region 176c, and a compensation drain region 177c. A compensation channel region is a portion of the compensation semiconductor layer 130c overlapping the compensation gate electrodes 125c1 and 125c2. The compensation gate electrodes 125c1 and 125c2 correspond to a portion of the scan line 121. The compensation gate electrodes 125c1 and 125c2 are dual-gate electrodes including the first gate electrode 125c1 and the second gate electrode 125c2 and may prevent or reduce occurrence of a leakage current. The compensation drain region 177c may be connected to the first storage capacitor plate 125a via a node connection line 174.

The node connection line 174 includes the same material as the data line 171 and may be in the same layer in which the data line 171 is arranged. A first end of the node connection line 174 is connected to the compensation drain region 177c and the initialization drain region 177d via a contact hole 166 in the first and second gate insulating layers GI1 and GI2 and the interlayer insulating layer ILD. A second end of the node connection line 174 is connected to the first storage capacitor plate 125a via a contact hole 167 in the second gate insulating layer GI2 and the interlayer insulating layer ILD. The second end of the node connection line 174 may be connected to the first storage capacitor plate 125a via a storage capacitor plate opening 127a of a second storage capacitor plate 127.

The first initialization TFT T4 includes a first initialization semiconductor layer 130d, a first initialization gate electrode 125d, a first initialization source region 176d, and a first initialization drain region 177d. A first initialization channel region is a portion of the first initialization semiconductor layer 130d overlapping the first initialization gate electrode 125d. The first initialization gate electrode 125d corresponds to a portion of the previous scan line 122.

One of the first initialization source region 176d and the first initialization drain region 177d may be connected to the initialization voltage line 124. The other of the first initialization source region 176d and the first initialization drain region 177d may be connected to the driving TFT T1. For example, the first initialization source region 176d is connected to the initialization voltage line 124 via an initialization connection line 173. The initialization voltage line 124 may include the same material as the second storage capacitor plate 127 and may be in the same layer as the second storage capacitor plate 127. One end of the initialization connection line 173 may be connected to the initialization voltage line 124 via a contact hole 161 in the second gate insulating layer GI2 and the interlayer insulating layer ILD. Another end of the initialization connection line 173 may be connected to the initialization source region 176d via a contact hole 162 in the first gate insulating layer GI1, the second gate insulating layer GI2, and the interlayer insulating layer ILD.

The operation control TFT T5 includes an operation control semiconductor layer 130e, an operation control gate electrode 125e, an operation control source region 176e, and an operation control drain region 177e. An operation control channel region may be a portion of the operation control semiconductor layer 130e overlapping the operation control gate electrode 125e. The operation control gate electrode 125e corresponds to a portion of the emission control line 123.

One of the operation control source region 176e or the operation control drain region 177e may be connected to the driving voltage line 172. The other of the operation control source region 176e or the operation control drain region 177e may be connected to the driving TFT T1. For example, the operation control source region 176e may be electrically connected to the driving voltage line 172 via a contact hole 165 in the first and second gate insulating layers GI1 and GI2 and the interlayer insulating layer ILD. In this case, when needed, a portion of the driving voltage line 172, for example, a portion neighboring the contact hole 165, may be understood to correspond to the operation control source region 176e, that is, an operation control source electrode of the operation control TFT T5.

The emission control TFT T6 includes an emission control semiconductor layer 130f, an emission control gate electrode 125f, an emission control source region 176f, and an emission control drain region 177f. An emission control channel region is a portion of the emission control semiconductor layer 130f overlapping the emission control gate electrode 125f. The emission control gate electrode 125f corresponds to a portion of the emission control line 123.

One of the emission control source region 176f or the emission control drain region 177f may be connected to the driving TFT T1. The other of the emission control source region 176f or the emission control drain region 177f may be connected to the second initialization TFT T7 and the pixel electrode 310. For example, the emission control drain region 177f may be connected to an intermediate connection layer 175 via a contact hole 163 passing through the first and second gate insulating layers GI1 and GI2 and the interlayer insulating layer ILD. In this case, the intermediate connection layer 175 may be understood to correspond to an emission control drain region 177f, that is, an emission control drain electrode of the emission control TFT T6. The intermediate connection layer 175 may be in the same layer as the data line 171 and may include the same material as the data line 171. For example, the intermediate connection layer 175 may be on the interlayer insulating layer ILD. The intermediate connection layer 175 is electrically connected to the pixel electrode 310 of the OLED via the contact hole 183.

The second initialization TFT T7 includes a second initialization semiconductor layer 130g, a second initialization gate electrode 125g, a second initialization source region 176g, and a second initialization drain region 177g. A second initialization channel region is a portion of the second initialization semiconductor layer 130g overlapping the second initialization gate electrode 125g. The second initialization gate electrode 125g corresponds to a portion of the previous scan line 122.

One of the second initialization source region 176g or the second initialization drain region 177g is connected to the emission control TFT T6 and the pixel electrode 310. The other of the second initialization source region 176g or second initialization drain region 177g is connected to the initialization voltage line 124. For example, the second initialization source region 176g is connected to the emission control drain region 177f of the emission control TFT T6 and the pixel electrode 310 of the OLED. The second initialization drain region 177g is connected to the first initialization source region 176d of the first initialization TFT T4 and the initialization voltage line 124. The second initialization TFT T7 is turned on based on a previous scan signal from the previous scan line 124 to initialize the pixel electrode 310 of the OLED.

The pixel electrode 310 is on a planarization insulating layer PL thereunder. The planarization insulating layer PL may cover the data line 171, the driving voltage line 172, the initialization connection line 173, the node connection line 174, and the intermediate connection line 175. The planarization insulating layer PL may include an organic material. The organic material may include, for example, a general-purpose polymer such as an imide-based polymer, polymethylmethacrylate (PMMA) or polystyrene (PS), or polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof, but the embodiment is not limited thereto.

A pixel-defining layer PDL may be on the pixel electrode 310 and include openings to define corresponding pixels, e.g., openings at least a central portion of corresponding pixel electrodes 310. Also, the pixel-defining layer PDL may prevent an arc, etc., from occurring between the pixel electrode 310 and the opposite electrode 330 by increasing the distance between the edge of the pixel electrode 310 and the opposite electrode 330. The pixel-defining layer PDL may include, for example, an organic material such as PI or hexamethyldisiloxane (HMDSO).

An intermediate layer 320 may include an emission layer 322, and a first functional layer 321 and a second functional layer 323 respectively under and on the emission layer 322. The first functional layer 321 may include a hole injection layer (HIL) and/or a hole transport layer (HTL). The second functional layer 323 may include an electron transport layer (ETL) and/or an electron injection layer (EIL).

The intermediate layer 320 may include, for example, a low molecular or polymer material. When the intermediate layer 320 includes a low molecular material, the intermediate layer 320 may have a structure in which an HIL, an HTL, an emission layer (EML), an ETL, an EIL, etc. are stacked in a single or a composite configuration. The intermediate layer 320 may include, for example, organic materials such as copper phthalocyanine (CuPc), N,N'-Di(naphthalene-1-yl)-N,N'-diphenyl-benzidine (NPB), or tris-8-hydroxyquinoline aluminum (Alq3). These layers may be formed, for example, by a deposition process.

When the intermediate layer 320 includes a polymer material, the intermediate layer 320 may generally have a structure including an HTL and an EML. For example, the HTL may include a PEDOT, and the EML may include a polymer material such as polyphenylene vinylene (PPV)-based material and a polyfluorene-based material. The structure and/or materials of the intermediate layer 320 may be different in another embodiment. For example, the intermediate layer 320 may include a layer having one body over a plurality of pixel electrodes 310 or may include a layer patterned to respectively correspond to the plurality of pixel electrodes 310.

The opposite electrode 330 is on the intermediate layer 320, serves as one body over a plurality of OLEDs, and may correspond to the plurality of pixel electrodes 310.

The storage capacitor Cst includes the first storage capacitor plate 125a and the second storage capacitor plate 127. The second storage capacitor plate 127 overlaps the first storage capacitor plate 125a, with the second gate insulating layer GI2 therebetween. By designing the circuit such that the storage capacitor Cst overlaps the driving TFT T1, even in the case where the size of a pixel is reduced depending on high resolution, areas of the first storage capacitor plate 125a and the second storage capacitor plate 127 may be secured and thus a high-quality image may be provided.

The scan line 121, the previous scan line 122, the emission control line 123, and the driving gate electrode 125a (or the first storage capacitor plate) may be on a same layer, for example, on the first gate insulating layer GI1 as illustrated in FIG. 4. The first gate insulating layer GI1 may include, for example, an inorganic insulating material such as SiOx, SiNx, and SiON.

The scan line 121, the previous scan line 122, the emission control line 123, and the driving gate electrode 125a (or the first storage capacitor plate) may include, for example, Mo, Al, Cu, Ti, etc., and may be a single layer or a multi-layer. For example, the scan line 121, the previous scan line 122, the emission control line 123, and the driving gate electrode 125a (or the first storage capacitor plate) may include a single layer including Mo.

The second storage capacitor plate 127 and the initialization voltage line 124 may be on a the same layer, for example, on the second gate insulating layer GI2 as illustrated in FIG. 4. The second gate insulating layer GI2 may include, for example, an inorganic insulating material such as SiOx, SiNx, and SiON.

The second storage capacitor plate 127 and the initialization voltage line 124 may include Mo, Al, Cu, and Ti and may be a single layer or a multi-layer. For example, the second storage capacitor plate 127 and the initialization voltage line 124 may include a single layer including Mo or a multi-layer including Mo/Al/Mo.

The data line 171, the driving voltage line 172, the initialization connection line 173, the node connection line 174, and the intermediate connection line 175 may be on a same layer, e.g., on the interlayer insulating layer ILD as illustrated in the display area DA of FIG. 4. The interlayer insulating layer ILD may include, for example, inorganic insulating material such as $SiOx$, $SiNx$, $SiON$, $Al_2O_3$, $TiO_2$, $Ta_2O_5$, $HfO_2$, or $ZnO_2$.

The data line 171, the driving voltage line 172, the initialization connection line 173, the node connection line 174, and the intermediate connection line 175 may include the same material. The data line 171, the driving voltage line 172, the initialization connection line 173, the node connection line 174, and the intermediate connection line 175 may include Al, Cu, Ti, etc., and may be a single layer or a multi-layer. In an embodiment, the data line 171, the driving voltage line 172, the initialization connection line 173, the node connection line 174, and the intermediate connection line 175 may have a multi-layered structure including Ti/Al/Ti.

The data line 171 is connected to the switching source region 176b via a contact hole 164 having a size that is adjusted by a spacer 108, for example, as illustrated in FIG. 4. The spacer 108 is on an inner wall of a hole H passing through the first gate insulating layer GI1, the second gate insulating layer GI2, and the interlayer insulating layer ILD. A first lateral surface of the spacer 108 may directly contact an inner wall of the first gate insulating layer GI1 facing the hole H, an inner wall of the second gate insulating layer GI2 facing the hole H, and an inner wall of the interlayer insulating layer ILD facing the hole H. A second lateral surface of the spacer 108, which is opposite to the first lateral surface, may directly contact the data line 171. A lower surface of the spacer 108 may directly contact the switching semiconductor layer 130b, for example, the switching source region 176b.

The spacer 108 may include an insulating material or metal. The insulating material may include an inorganic insulating material such as SiNx, SiOx, and SiON, or SiOC (silicon oxycarbide). The metal may include, for example, Mo, Ti, Al, etc. In one embodiment, the spacer 108 may include the same metallic element as the data line 171. For example, when the data line 171 has a three-layered structure including Ti/Al/Ti, the spacer 108 may include Ti.

Referring to FIG. 4, the size of the contact hole 163 between the intermediate connection layer 175 and the emission control drain region 177f may be adjusted by the spacer 108. The intermediate connection layer 175 may be in the same layer as the data line 171 and include the same material as the data line 171. In this case, the first lateral surface of the spacer 108 may directly contact an inner wall of the first gate insulating layer GI1 facing the hole H, an inner wall of the second gate insulating layer GI2 facing the hole H, and an inner wall of the interlayer insulating layer ILD facing the hole H. The second lateral surface of the spacer 108, which is opposite to the first lateral surface, may directly contact the intermediate connection layer 175. A lower surface of the spacer 108 may directly contact the emission control semiconductor layer 130f, for example, the emission control drain region 177f.

The size of a contact hole 165 connecting the operation control semiconductor layer 130e to the driving voltage line 172, in the same layer in which the data line 171 is arranged and including the same material as that of the data line 171, the size of a contact hole 162 connecting the initialization connection line 173 to the first and second initialization semiconductor layers 130d and 130g, and/or the size of a contact hole 166 connecting the node connection line 174 to the compensation semiconductor layer 130c may be adjusted by the spacer 108. In this case, the first lateral surface of the spacer 108 may directly contact an inner wall of the first gate insulating layer GI1 facing the hole H, an inner wall of the second gate insulating layer GI2 facing the hole H. and an inner wall of the interlayer insulating layer ILD facing the hole H. The second lateral surface of the spacer 108 contacts respective wirings (e.g. the driving voltage line 172, the initialization connection line 173, and the node connection line 174).

Figure 5A:
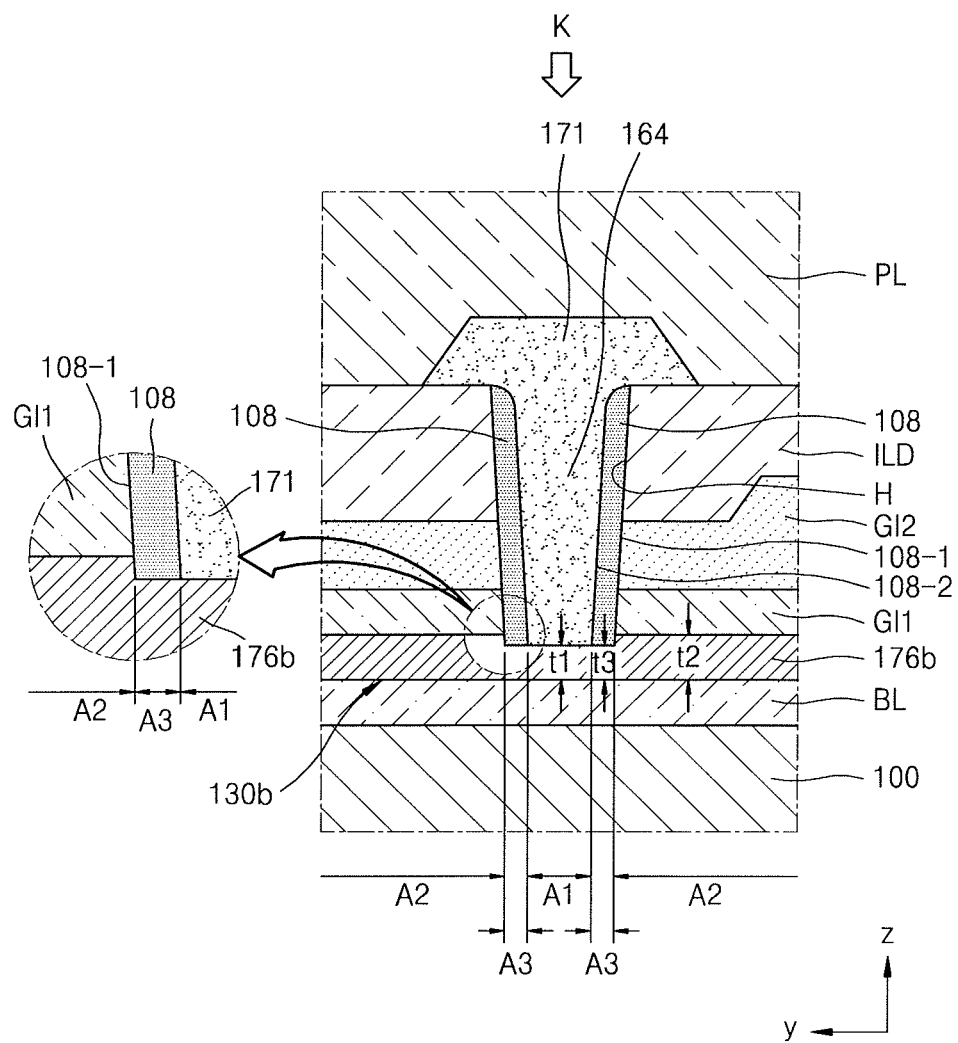
FIGS. 5A and 5B illustrate embodiments of a portion V in FIG. 4.
Figure 5B:
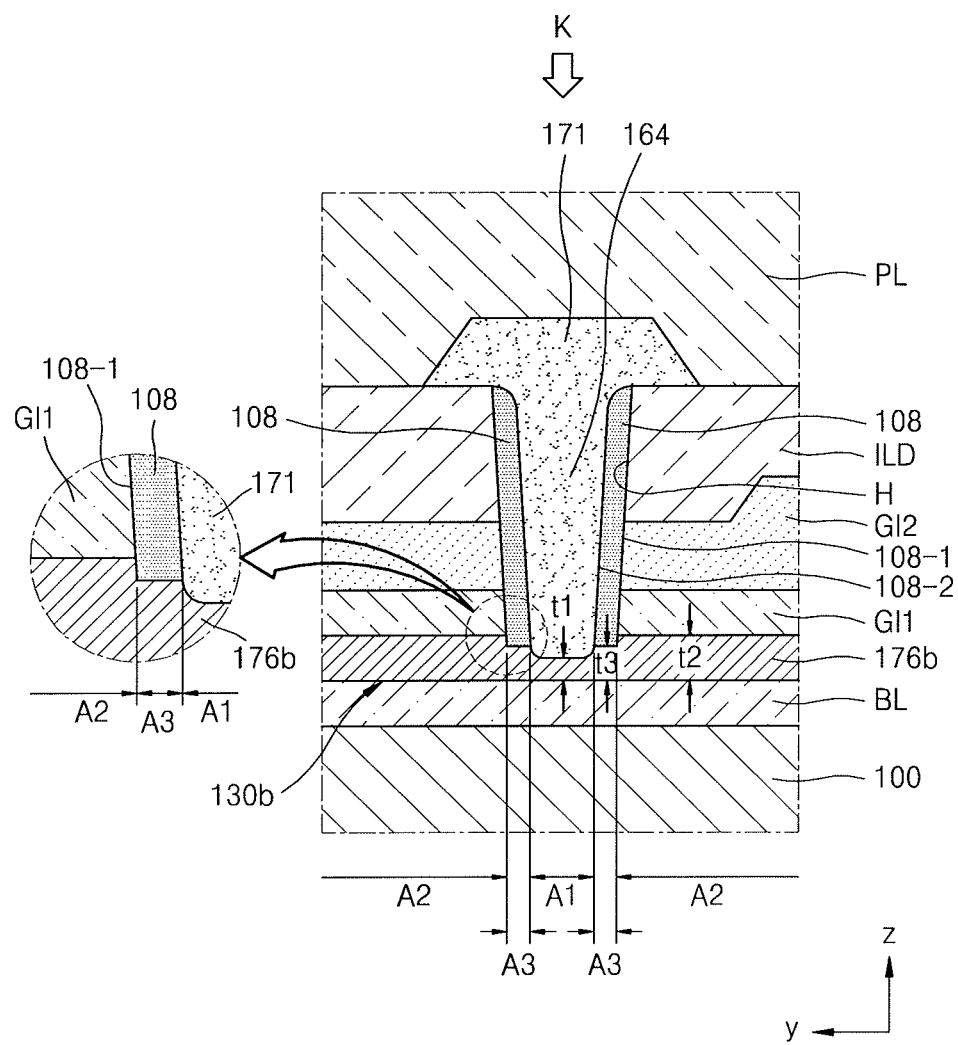
Figure 6:
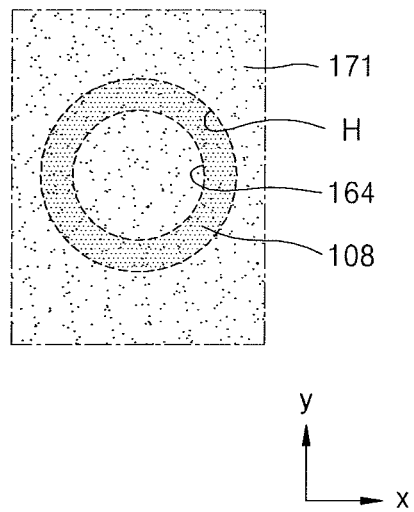
FIG. 6 illustrates a plan view of FIGS. 5A and 5B viewed from a direction K.

FIGS. 5A and 5B are cross-sectional views of embodiments a portion V of FIG. 4. FIG. 6 is a plan view of FIGS. 5A and 5B viewed from a direction K.

Referring to FIGS. 5A and 5B, the data line 171 contacts the switching semiconductor layer 130b and simultaneously contacts the spacer 108. For example, a lower surface of the data line 171 may directly contact the switching source region 176b of the switching semiconductor layer 130b. One lateral surface of a portion inside a contact hole 164 of the data line 171, for example, one lateral surface facing an inner wall of the hole H, may directly contact the spacer 108.

The spacer 108 is on the inner wall of the hole H passing through the insulating layers, for example, the first and second gate insulating layers GI1 and GI2 and the interlayer insulating layer ILD and directly contacts the data line 171 and the switching semiconductor layer 130b.

A first lateral surface 108-1 of the spacer 108 directly on and contacts the inner wall of the hole H. For example, the first lateral surface 108-1 of the spacer 108 directly contacts and covers the inner walls of the first and second gate insulating layers GI1 and GI2 and the interlayer insulating layer ILD. A second lateral surface 108-2 of the spacer 108, which is opposite to the first lateral surface 108-1, may directly contact the data line 171. A lower surface of the spacer 108 may directly contact a portion of the switching source region 176b.

The switching semiconductor layer 130b, for example, the switching source region 176b, may include a first region A1 contacting the data line 171 and include second regions A2 overlapping the first and second gate insulating layers GI1 and GI2 and the interlayer insulating layer ILD. Also, the switching source region 176b may include a third region A3 between the first region A1 and the second region A2, overlapping the spacer 108, and contacting a bottom of the spacer 108. The first to third regions A1, A2, and A3 are partial regions of the switching semiconductor layer 130b doped with impurities, for example, partial regions of the switching source region 176b which include the same impurities as those of the switching source region 176b.

The second region A2 and the third region A3 may form a step. The third region A3 may have a thickness t3 less than a thickness t2 of the second region A2. In this case, the first lateral surface 108-1 of the spacer 108 may contact all of the switching source region 176b, the first and second gate insulating layers GI1 and GI2, and the interlayer insulating layer ILD.

The first region A1 may have a thickness t1 equal to or less than the thickness t3 of the third region A3. In an embodiment, as illustrated in FIG. 5A, the first region A1 may have the thickness t1 equal to the thickness t3 of the third region A3. In another embodiment, as illustrated in FIG. 5B, the first region A1 may have the thickness t1 less than the thickness t3 of the third region A3, and the third region A3 may have the thickness t3 less than the thickness t2 of the second region A2. In this case, the first region A1 and the third region A3 may form a step difference. A connection portion between the first region A1 and the third region A3 may have a forward-tapered slope surface. In an embodiment, the forward-tapered slope surface may have a relatively flat shape or may be rounded. FIG. 5B illustrates an example of a forward-tapered rounded slope surface.

As illustrated in FIGS. 5A and 5B, a connection portion between the second region A2 and the third region A3 may have a forward-tapered slope surface. FIGS. 5A and 5B illustrate a relatively flat and forward-tapered slope surface. In another embodiment, the slope surface may be a forward-tapered rounded surface.

Referring to FIGS. 5A, 5B, and 6, since the size of the hole H may be adjusted by the spacer 108, electric connection between the data line 171 and the switching semiconductor layer 130b, for example, the switching source region 176b may have a reduced contact area. The hole H passing through the first and second gate insulating layers GI1 and GI2 and the interlayer insulating layer ILD may be formed by an etching process, using a photoresist as a mask. Thus, it is not easy to adjust the hole H to a small size due to resolution limits of a photoresist exposure process. This phenomenon may substantially worsen as the depth of the hole H increases, that is, as the thickness of a layer(s) in which the hole H is increases or as the number of the layers in which the hole H is formed increases.

However, in accordance with one or more embodiments, contact size may be adjusted using the spacer 108. Thus, the size of the contact area between the data line 171 and the switching semiconductor layer 130b may be easily adjusted.

Also, as the size of the contact area between the data line 171 and the switching semiconductor layer 130b is reduced, the linewidth of the data line 171 may be adjusted (e.g. a linewidth of the data line 171 may be adjusted to a small linewidth), and the space may be variously utilized with reduced or minimum design limit in a high resolution display device having a complicated pixel design.

In FIGS. 5A to 6, the spacer 108 is mainly around the contact hole 164 between the data line 171 and the switching source region 176b, but present structure may be readily applicable to the contact between the intermediate connection layer 175 and the emission control drain region 177f, the contact between the driving voltage line 172 and the operation control semiconductor layer 130e, the contact between the initialization connection line 173 and the first and second initialization semiconductor layers 130d and 130g, and/or the contact between the node connection line 174 and the compensation semiconductor layer 130c.

Figure 7A:
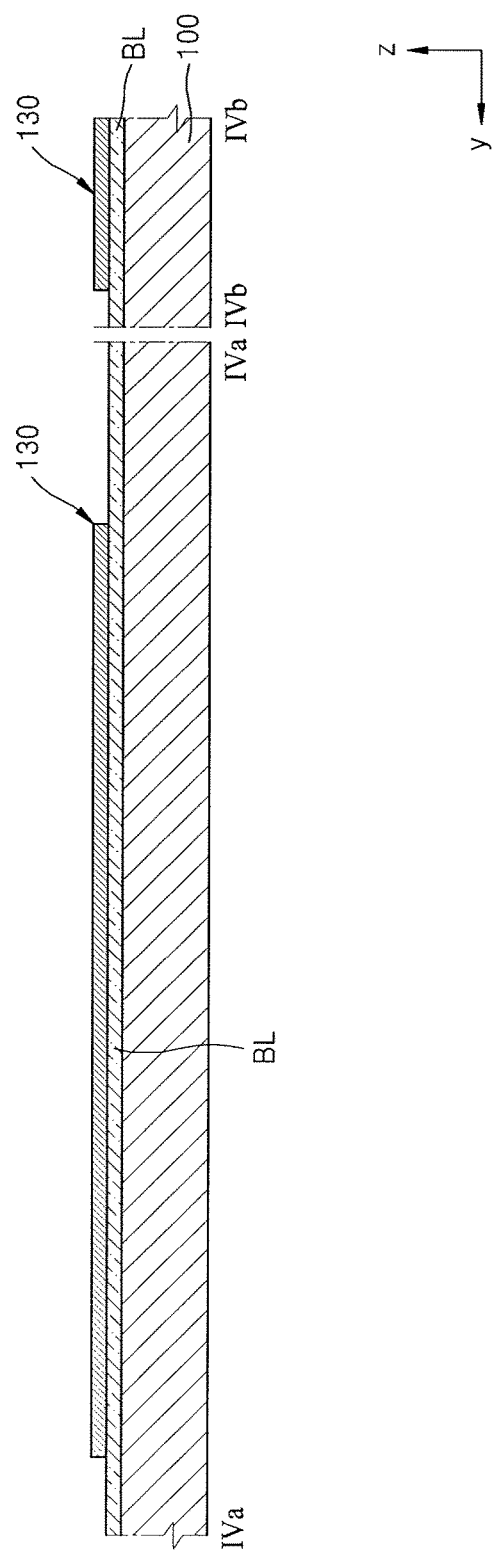
FIGS. 7A to 7H illustrate stages of an embodiment of a method for manufacturing a display device.

FIGS. 7A to 7H are cross-sectional views illustrating various stages of an embodiment of a method for manufacturing a display device. Referring to FIG. 7A, the buffer layer BL is formed on the substrate 100. Then, a semiconductor layer 130 may be formed by forming and patterning a semiconductor layer. The materials of the substrate 100, buffer layer BL, and semiconductor layer 130 may be the same as previously described.

Figure 7B:
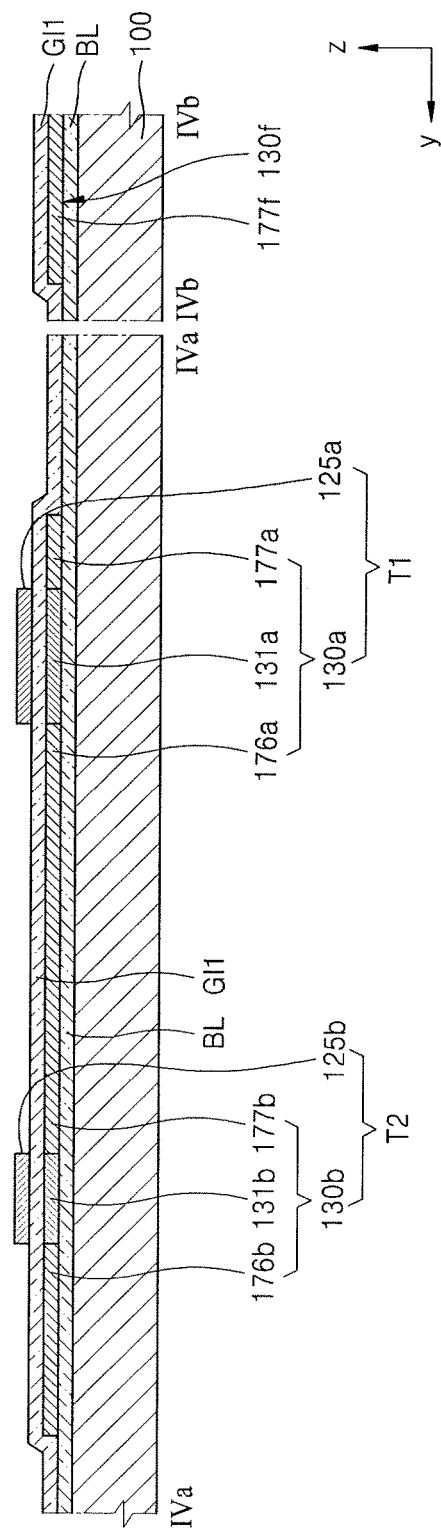

Referring to FIG. 7B, a wiring layer and the driving gate electrode 125a are formed by forming the first gate insulating layer GI1 on the semiconductor layer 130 and forming and patterning a metallic material layer. The wiring layer may correspond to the scan line 121, previous scan line 122, and emission control line 123 described with reference to FIG. 3. The switching gate electrode 125b corresponds to a portion of the scan line 121 (e.g., see FIG. 3). The materials of the first gate insulating layer GI1 and the gate electrode may be, for example, the same as those previously described. FIG. 7B illustrates the driving gate electrode 125a and the switching gate electrode 125b.

Subsequently, the semiconductor layer 130 may be doped with impurities with the signal lines 121, 122, and 123, and the driving gate electrode 125a used as self-aligned masks. The impurities may be N-type impurities or P-type impurities. Partial regions of the semiconductor layer 130 doped with impurities may correspond to a source region and a drain region. Partial regions of the semiconductor layer 130 overlapping the signal lines 121, 122, and 123 and the driving gate electrode 125a may correspond to a channel region. The driving gate electrode 125a and portions of the signal lines 121, 122, and 123 respectively correspond to a gate electrode.

FIG. 7B illustrates the driving source region 176a, the driving drain region 177a, and the driving channel region 131a of the driving semiconductor layer 130a therebetween; the switching source region 176b, the switching drain region 177b, and the switching channel region 131b of the switching semiconductor layer 130b therebetween; and the emission control drain region 177f, which is a portion of the emission control semiconductor layer 130f.

Figure 7C:
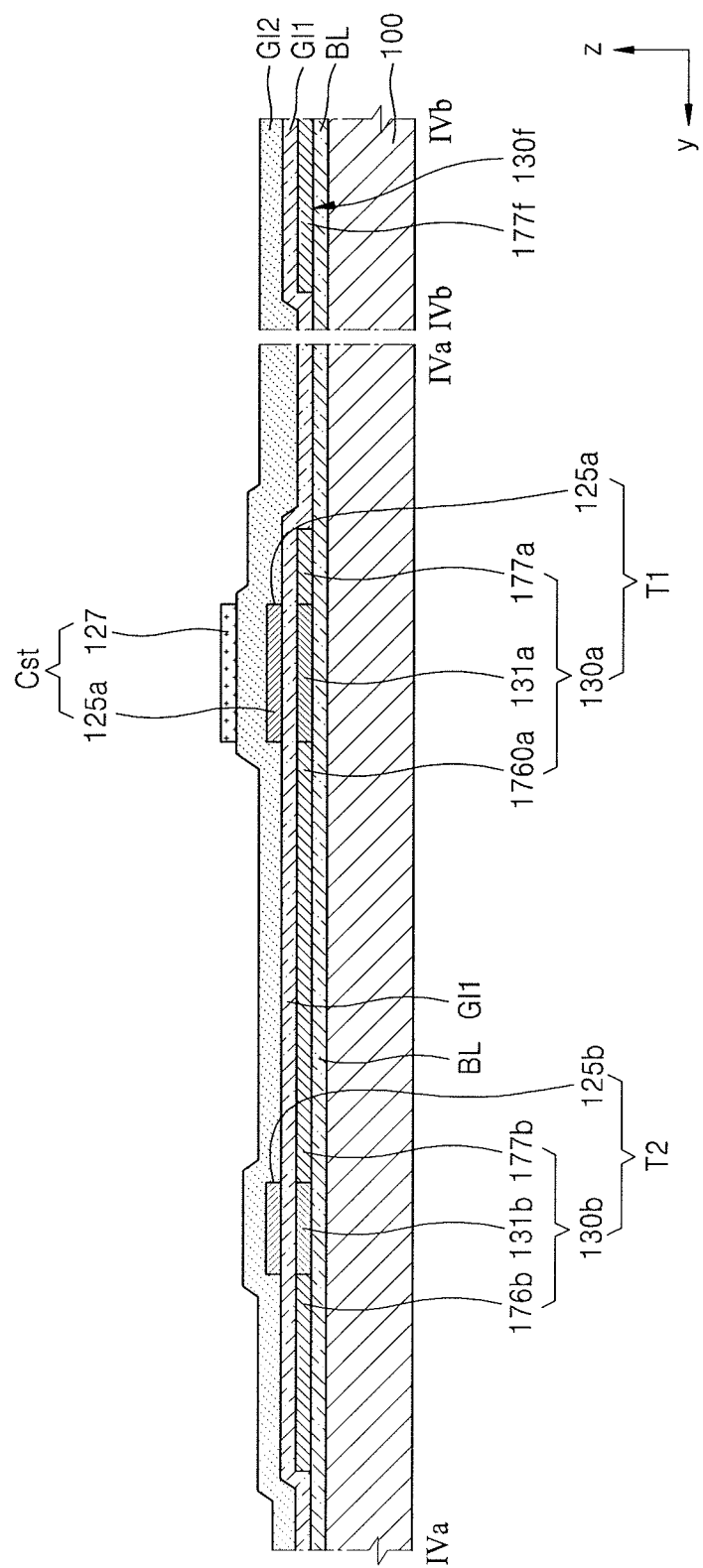

Referring to FIG. 7C, the second storage capacitor plate 127 is formed by forming the second gate insulating layer GI2 and forming and patterning a metallic material layer. The initialization voltage line 124 may be simultaneously formed with the second storage capacitor plate 127.

In an embodiment, when the driving gate electrode 125a serves as the first storage capacitor plate 125a, the second storage capacitor plate 127 may overlap the driving gate electrode 125a. In another embodiment, when the first storage capacitor plate 125a is formed as an element separated from the driving gate electrode 125a, a location of the second storage capacitor plate 127 may be changed.

Figure 7D:
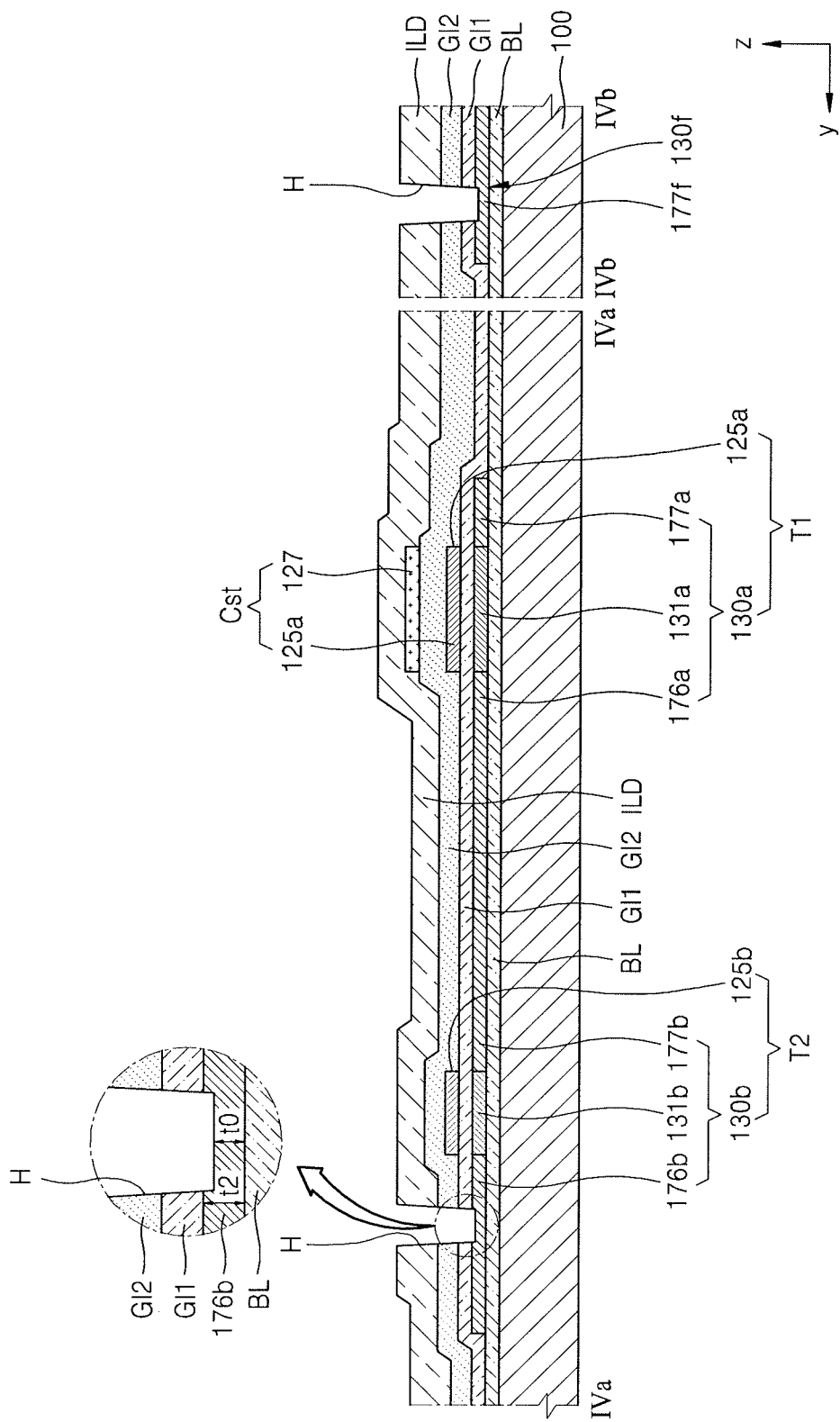

Referring to FIG. 7D, the interlayer insulating layer ILD is formed on the second storage capacitor plate 127, and the hole H exposing a portion of the semiconductor layer 130 is formed. For example, a photoresist pattern layer, in which a portion corresponding to a region used as the hole H is open, may be formed by forming a photoresist layer on the interlayer insulating layer ILD and performing exposure and developing processes on the photoresist layer. The hole H may be formed, for example, by etching (e.g. dry etching) using the photoresist pattern layer on the interlayer insulating layer ILD as a mask. After the hole H is formed, the photoresist pattern layer is removed by a strip process.

A portion of the semiconductor layer, that is, a portion of a region doped with impurities, may be exposed. FIG. 7D illustrates a structure in which a portion of the switching semiconductor layer 130b, for example, the switching source region 176b, is exposed and a portion of the emission control semiconductor layer 130f, for example, the emission control drain region 177f, is exposed via the hole H.

Referring to an enlarged section of FIG. 7D, during the etching process for forming the hole H, while a portion of the semiconductor layer 130 (e.g., a portion corresponding to the hole H) is consumed, the thickness t0 of the portion corresponding to the hole H may become less than the thickness t2 of a neighboring portion, for example, an overlapping portion of the first and second gate insulating layers GI1 and GI2 and the interlayer insulating layer ILD. The semiconductor layer 130 may have a step portion around the hole H, and a slope surface of the step portion may be forward-tapered. Although the enlarged section of FIG. 7D illustrates that the switching source region 176b has been stepped around the portion including the hole H, such a structure is readily applicable to a portion of the hole H in the emission control drain region 177f.

Figure 7E:
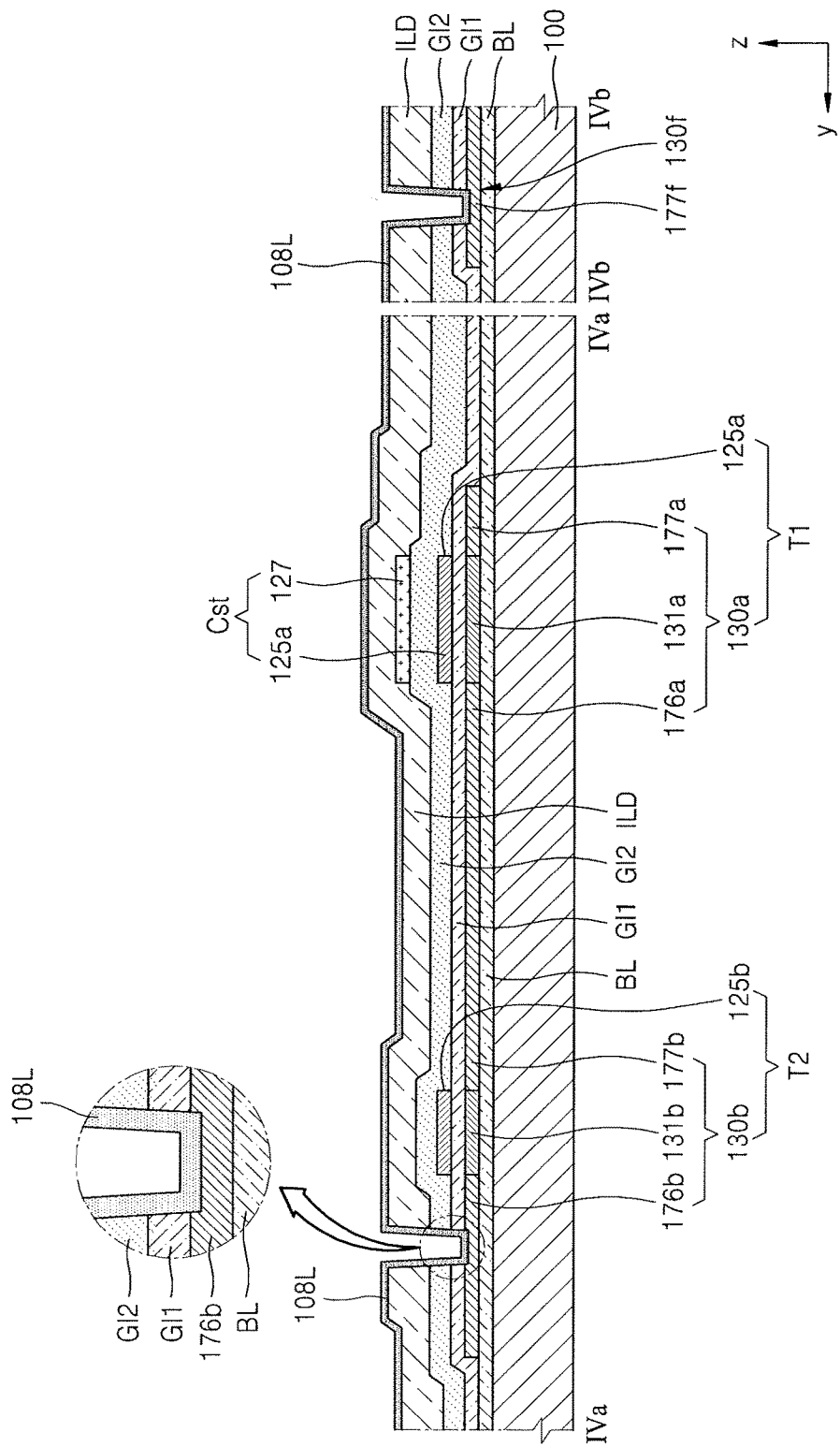

Referring to FIG. 7E, a spacer material layer 108L is formed on the inner wall of the hole H and the interlayer insulating layer ILD. The spacer material layer 108L may include, for example, a material having etching selectivity with the semiconductor layer 130 greater than about 2 (2.0). The spacer material layer 108L may include an insulating material or metal. The insulating material of the spacer material layer 108L may include, for example, SiOx, SiNx, SiON, SiOC, etc., and may be formed by chemical vapor deposition (CVD). The metal of the spacer material layer 108L may include, for example, Mo, Ti, Al, etc., and may be formed by sputtering.

Before the spacer material layer 108L is formed, deionized (DI) washing or hydrofluoric acid (HF) washing may optionally be performed on the substrate 100 in which the hole H has been formed.

Figure 7F:
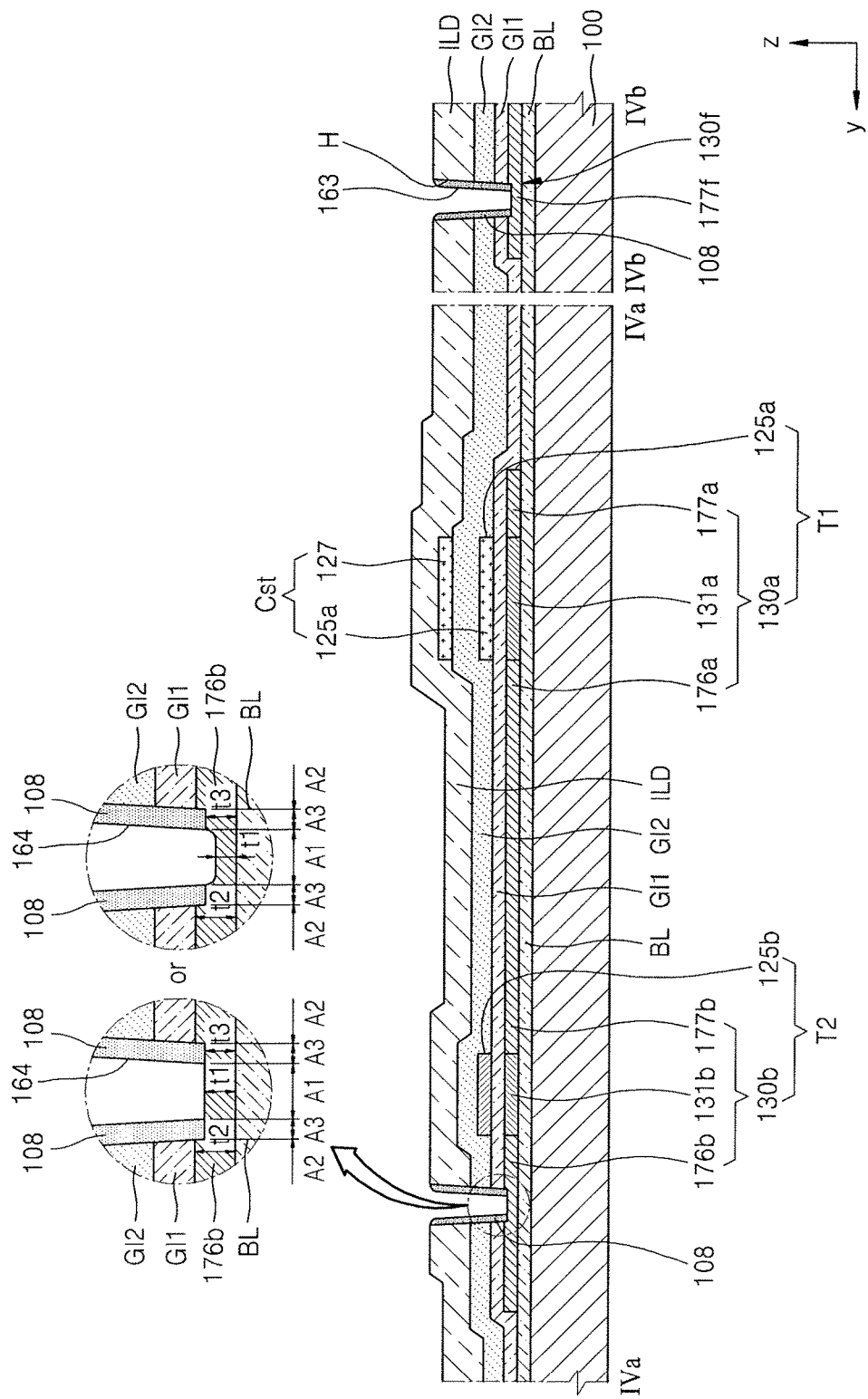

Referring to FIG. 7F, the spacer 108 is formed by etching a portion of the spacer material layer 108L. The spacer 108 may be formed, for example, by dry etching. The spacer 108 is formed on the inner wall of the hole H by removing a portion of the spacer material layer 108L contacting an upper surface of the interlayer insulating layer ILD and a portion of the spacer material layer 108l contacting an upper surface of the semiconductor layer 130 through dry etching. Also, the contact holes 163 and 164 exposing the semiconductor layer 130 are formed in the inner surface of the spacer 108.

Each of the contact holes 163 and 164, having sizes less than that of the hole H, may be formed by the spacer 108. Sizes of the contact holes 163 and 164 may be adjusted depending on a thickness of the spacer 108. FIG. 7F illustrates the contact hole 164 having a size, e.g. a diameter, reduced by the spacer 108 and exposing the switching source region 176f, and the contact hole 163 having a size, e.g. a diameter, reduced by the spacer 108 and exposing the emission control drain region 177f. Each of the switching source region 176f and the emission control drain region 177f includes the first region A1, the second region A2, and the third region A3. The first region A1 may overlap the contact hole 164 or 163. The second region A2 may overlap the first and second gate insulating layers GI1 and GI2, and the interlayer insulating layer ILD. The third region A3 may be between the first region A1 and the second region A2 and may overlap the spacer 108.

While a portion of the spacer material layer 108L covering the upper surface of the semiconductor layer 130 is removed by dry etching described with reference to FIGS. 7E and 7F, a portion of the semiconductor layer 130 may be or may not be consumed.

In an embodiment, as illustrated in one of enlarged sections of FIG. 7F, the first region A1 of the switching source region 176f exposed via the contact hole 164 may not be consumed while the spacer material layer 108L on the first region A1 is removed. In this case, the first region A1 may have the thickness t1 which is substantially same as the thickness t3 of the third region A3.

In another embodiment, as illustrated in one of enlarged sections of FIG. 7F, the first region A1 of the switching source region 176f exposed via the contact hole 164 may be consumed while the spacer material layer 108L on the first region A1 is removed. In this case, the first region A1 may have the thickness t1 less than the thickness t3 of the third region A3, and a step difference may be formed around the contact hole 164. The step difference between the first region A1 and third region A3 may have a sloped surface. As described with reference to FIGS. 5A and 5B, the sloped surface may be, for example, a relatively flat or rounded forward-tapered slope surface.

In FIG. 7F, the thickness t3 of the third region A3 of the switching source region 176f may be equal to the thickness t0 of a corresponding portion of the switching semiconductor layer 130b described above with reference to FIG. 7D.

Figure 7G:
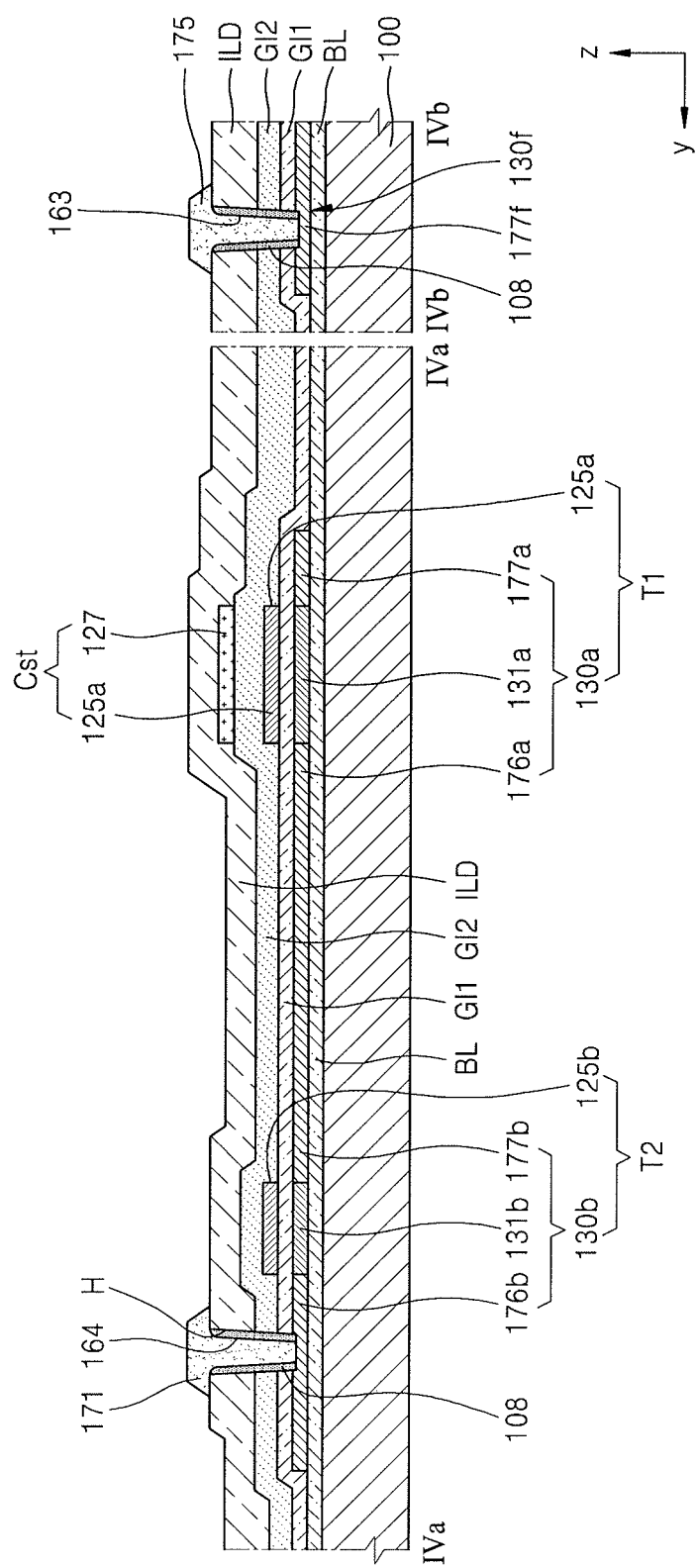

Referring to FIG. 7G, a wiring layer such as the data line 171 is formed by forming and patterning a metallic material layer on the spacer 108. The wiring layer corresponds to not only the data line 171 but also the driving voltage line 172, the initialization connection line 173, the node connection line 174, and the intermediate connection layer 175. FIG. 7G illustrates a structure in which the data line 171 and the intermediate connection layer 175 are formed.

The data line 171 directly contacts the semiconductor layer 130, for example, the switching source region 176b via the contact hole 164 defined by the spacer 108. The intermediate connection layer 175 directly contacts the semiconductor layer 130, for example, the emission control drain region 177f via the contact hole 163 defined by the spacer 108. The data line 171 and the intermediate connection layer 175 contact the spacer 108 and extend to contact the semiconductor layer 130 thereunder.

Figure 7H:
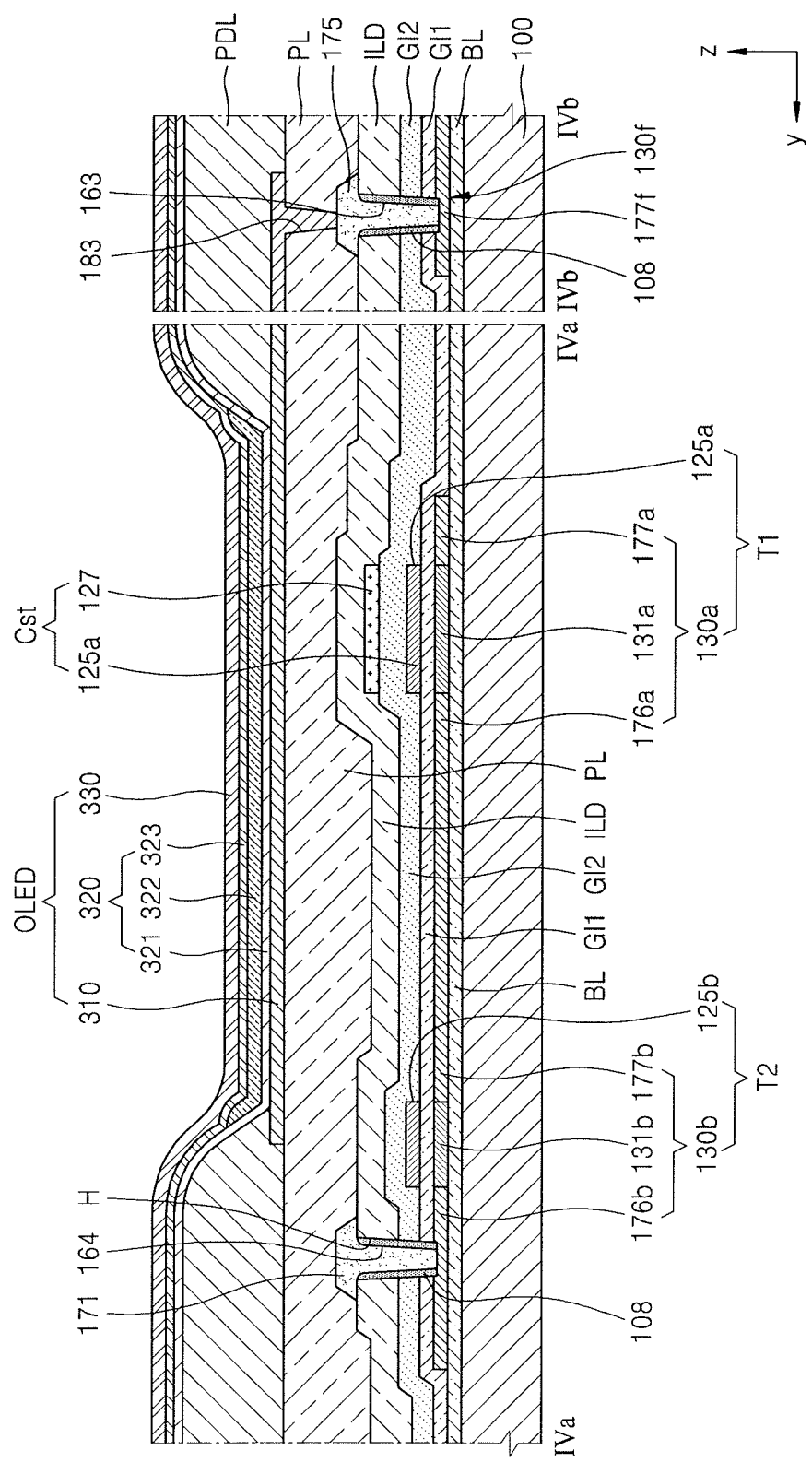

Referring to FIG. 7H, a planarization insulating layer PL is formed and the pixel electrode 310 contacting the intermediate connection layer 175 via a contact hole 183 of the planarization insulating layer PL is formed. Then, the pixel-defining layer PDL including an opening exposing the pixel electrode 310, the intermediate layer 320 including an emission layer on the pixel electrode 310, and the opposite electrode 330 on the intermediate layer 320 are formed.

As a comparative example, when using the hole H formed by the process described with reference to FIG. 7D without forming the spacer 108, the size of the contact hole for connecting the data line 171 to the switching semiconductor layer 130b becomes the size of the hole H. The size of the hole H, for example, a diameter of the hole H, is determined by exposure of a photoresist layer. However, reducing the diameter of the hole H is limited due to resolution limits in exposing the photoresist layer. That is, when using the hole H as a contact hole for connection between the data line 171 and the switching semiconductor layer 130b, a contact area therebetween is relatively large. Thus, the extent to which the width of the data line 171 and the extent to which the size of a pixel can be reduced is limited.

However, according to one or more embodiments, the diameter of the hole H may be controlled small using the spacer 108. As a result, the diameter of the contact hole 164 may be controlled to, for example, reduced (e.g., about 1.5 mμ or less or about 1.0 μm or 0.5 μm). Therefore, the linewidth of the data line 171 may be reduced and spatial limitations may be reduced or minimized.

Figure 8:
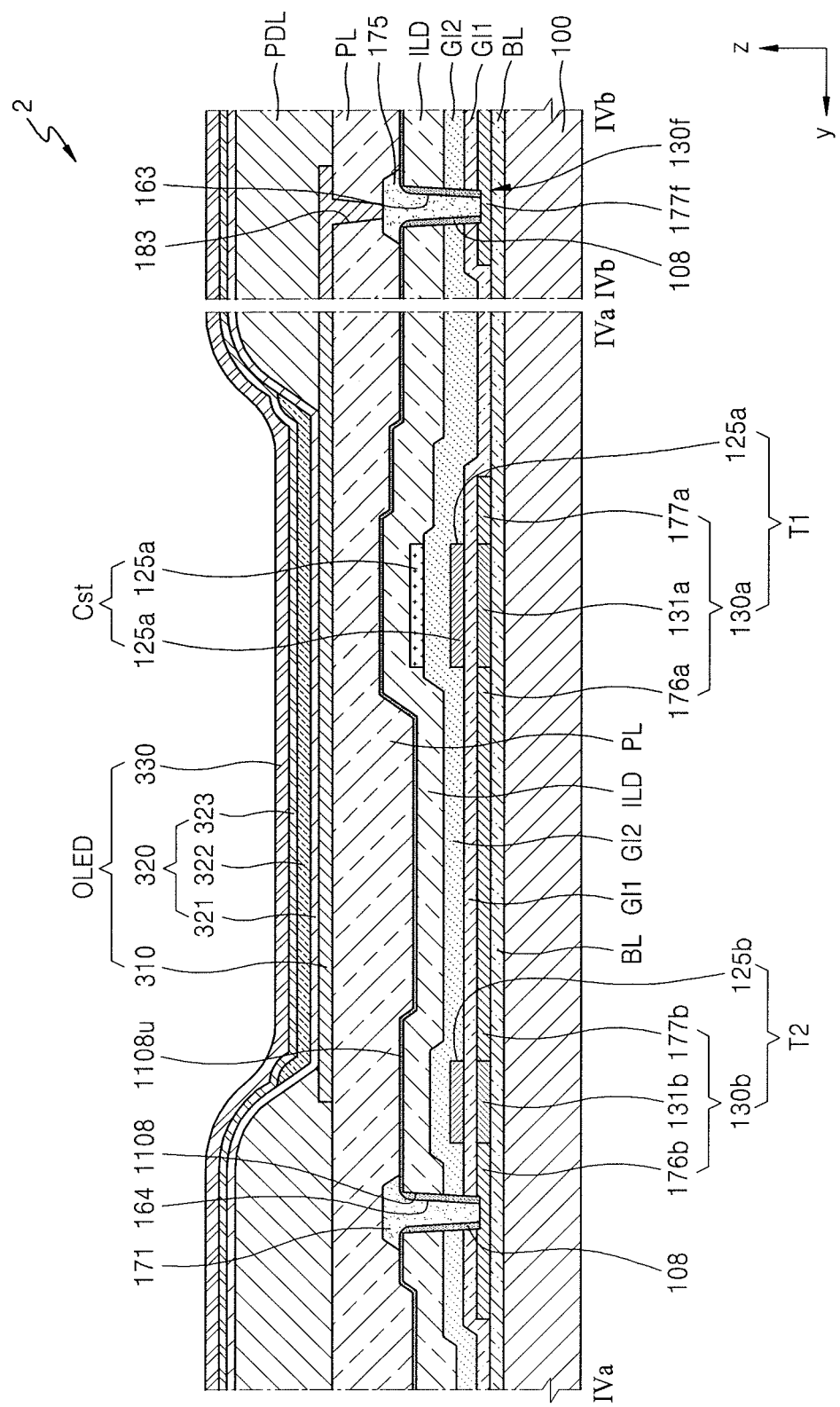
FIG. 8 illustrates another embodiment of a display device.
Figure 9:
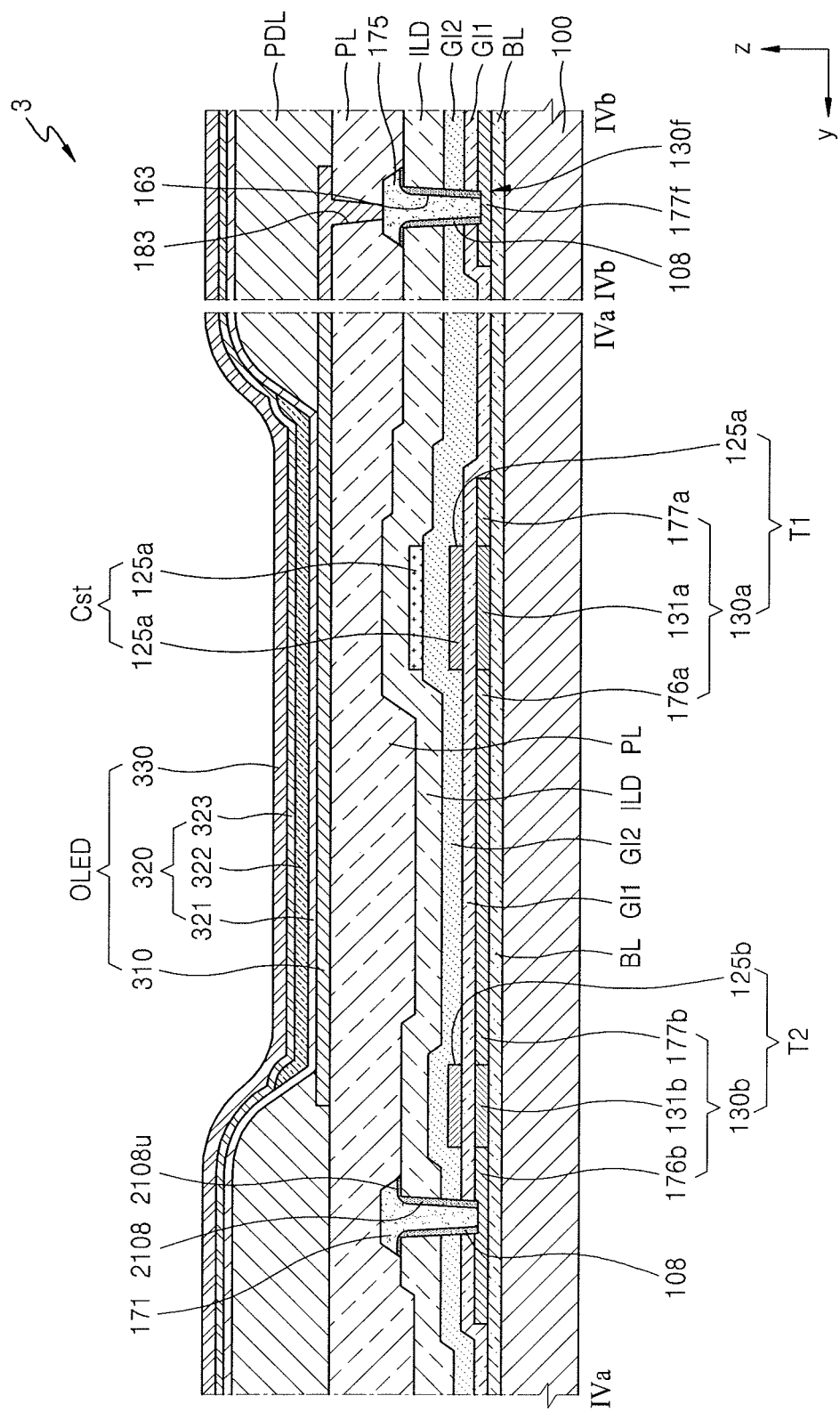
FIG. 9 illustrates another embodiment of a display device.

FIGS. 8 and 9 are cross-sectional views illustrating additional embodiments of a display device 1 and 3. The display devices 2 and 3 of FIGS. 8 and 9 are substantially the same as the display device 1 described with reference to FIG. 4 in their structure, except for spacers 1108 and 2108.

Referring to FIG. 8, one end (upper portion) 1108u of the spacer 1108 may extend toward an upper surface of the interlayer insulating layer ILD and cover the upper surface of the interlayer insulating layer ILD. For example, one end 1108u of the spacer 1108 may directly contact the upper surface of the interlayer insulating layer ILD. In this case, the spacer 1108 includes an insulating material.

Referring to FIG. 9, one end (upper portion) 2108u of the spacer 2108 may extend toward an upper surface of the interlayer insulating layer ILD and be patterned to have substantially the same pattern as that of the data line 171. In this case, the spacer 2108 may include metal like the data line 171. In an embodiment, the spacer 2108 may include the same material as at least one of the metallic elements of the data line 171. For example, the spacer 2108 may include Ti when the data line 171 includes Ti/Al/Ti.

The spacer 2108 may be formed simultaneously with the data line 171 during a patterning process for forming the data line 171. For example, after a process of forming a spacer material layer for forming the spacer 2108 described with reference to FIG. 7E, a metallic material layer may be formed for the data line 171 and the metallic material layer and the spacer material layer may be simultaneously patterned.

In accordance with one or more of the aforementioned embodiments, a contact area between wirings and electronic elements (such as a thin film transistor and a storage capacitor) may be adjusted. When the contact area is reduced, the width of wiring (e.g., a data line or other signal line) may be reduced. Also, electronic elements and wirings may be efficiently arranged in a narrow space. Thus, a display device suitable for high resolution may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:
1. A display device, comprising:
a substrate;
a thin film transistor on the substrate and including a semiconductor layer and a gate electrode, the semiconductor layer including a source region and a drain region on respective sides of a channel region;
a gate insulating layer between the semiconductor layer and the gate electrode;
an interlayer insulating layer covering the thin film transistor;
a data line contacting the semiconductor layer via a hole passing through the gate insulating layer and the interlayer insulating layer;
a spacer on an inner wall of the hole, contacting the data line, and penetrating into the semiconductor layer; and
a pixel electrode electrically connected to the thin film transistor, wherein:
the semiconductor layer includes a first region, a second region, and a third region, the third region being between the first region and the second region,
the first region contacts the data line and has a thickness less than that of the second region and the third region,
the third region contacts the spacer,
the first region is stepped from the third region, and
a connection portion between the first region and the third region has a forward-tapered slope.
2. The display device as claimed in claim 1, wherein:
a lower surface of the data line directly contacts one of the source region and the drain region, and
a surface of the data line facing an inner wall of the hole directly contacts the spacer.
3. The display device as claimed in claim 1, wherein the second region overlaps the gate insulating layer and the interlayer insulating layer.
4. The display device as claimed in claim 1, wherein the first region and the second region are doped with same impurities.
5. The display device as claimed in claim 1, wherein the third region has a thickness less than the second region.

6. The display device as claimed in claim 1, wherein the spacer includes:
a first lateral surface facing the inner wall of the hole, and
a lower surface facing one of the source region or the drain region, wherein the first lateral surface directly contacts the interlayer insulating layer, the gate insulating layer, and the semiconductor layer, and wherein the lower surface directly contacts one of the source region or the drain region.
7. The display device as claimed in claim 1, wherein the thin film transistor includes:
a driving thin film transistor includes a driving semiconductor layer and a driving gate electrode, the driving semiconductor layer including a driving channel region, a driving source region, and a driving drain region, and the driving gate electrode overlapping the driving channel region; and
a switching thin film transistor over the substrate and including a switching semiconductor layer and a switching gate electrode, the switching semiconductor layer including a switching channel region, a switching source region, and a switching drain region, the switching gate electrode overlapping the switching channel region, and the data line contacting one of the switching source region and the switching drain region.
8. The display device as claimed in claim 7, wherein the spacer includes metal.
9. The display device as claimed in claim 8, wherein the spacer includes a same metallic material as the data line.
10. The display device as claimed in claim 1, further comprising:
a second gate insulating layer between the gate insulating layer and the interlayer insulating layer; and
a first storage capacitor plate facing a second storage capacitor plate with the second gate insulating layer therebetween, the spacer directly contacting the interlayer insulating layer, the second gate insulating layer, the gate insulating layer, and the semiconductor layer.
11. The display device as claimed in claim 1, wherein the spacer includes an insulating material.
12. The display device as claimed in claim 11, wherein the insulating material includes at least one of SiOx, SiNx, SiON, or SiOC.
13. The display device as claimed in claim 1, wherein the spacer partially penetrates the semiconductor layer.
14. A display device, comprising:
a substrate;
a thin film transistor on the substrate and including a semiconductor layer and a gate electrode, the semiconductor layer including a source region and a drain region on respective sides of a channel region;
a gate insulating layer between the semiconductor layer and the gate electrode;
an interlayer insulating layer covering the thin film transistor;
a data line contacting the semiconductor layer via a hole passing through the gate insulating layer and the interlayer insulating layer;
a spacer on an inner wall of the hole, contacting the data line, and penetrating into the semiconductor layer; and
a pixel electrode electrically connected to the thin film transistor, wherein the spacer extends to an upper surface of the interlayer insulating layer and directly contacts at least a portion of the upper surface of the interlayer insulating layer.
15. The display device as claimed in claim 14, wherein the spacer includes an insulating material.

16. The display device as claimed in claim 15, wherein the insulating material includes at least one of SiOx, SiNx, SiON, or SiOC.

17. The display device as claimed in claim 14, wherein the spacer partially penetrates the semiconductor layer.

18. A display device, comprising:
a substrate;
a thin film transistor on the substrate and including a semiconductor layer and a gate electrode, the semiconductor layer including a source region and a drain region on respective sides of a channel region;
a gate insulating layer between the semiconductor layer and the gate electrode;
an interlayer insulating layer covering the thin film transistor;
a data line contacting the semiconductor layer via a hole passing through the gate insulating layer and the interlayer insulating layer;
a spacer on an inner wall of the hole and contacting the data line; and
a pixel electrode electrically connected to the thin film transistor, wherein:
the semiconductor layer includes a first region, a second region, and a third region, the third region being between the first region and the second region,
the first region contacts the data line and has a thickness less than that of the second region and the third region,
the third region contacts the spacer,
the first region is stepped from the third region, and
a connection portion between the first region and the third region has a forward-tapered slope.

19. A display device, comprising:
a substrate;
a first thin film transistor on the substrate;
a pixel electrode electrically connected to the first thin film transistor,
a second thin film transistor on the substrate and including a semiconductor layer and a gate electrode, the semiconductor layer including a source region and a drain region on respective sides of a channel region;
a gate insulating layer between the semiconductor layer and the gate electrode;
an interlayer insulating layer covering the thin film transistor;
a data line disposed between the substrate and the pixel electrode, and contacting the semiconductor layer via a hole passing through the gate insulating layer and the interlayer insulating layer; and
a spacer on an inner wall of the hole and contacting the data line;
wherein the spacer extends to an upper surface of the interlayer insulating layer and directly contacts at least a portion of the upper surface of the interlayer insulating layer.

* * * * *